US007825658B2

(12) United States Patent
Koga et al.

(10) Patent No.: US 7,825,658 B2
(45) Date of Patent: Nov. 2, 2010

(54) MAGNETIC DEVICE AND FREQUENCY DETECTOR

(75) Inventors: Keiji Koga, Saku (JP); Yuji Kakinuma, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 221 days.

(21) Appl. No.: 12/271,238

(22) Filed: Nov. 14, 2008

(65) Prior Publication Data

US 2009/0140733 A1 Jun. 4, 2009

(30) Foreign Application Priority Data

Nov. 26, 2007 (JP) ............................. P2007-305010

(51) Int. Cl.
*G01R 33/02* (2006.01)

(52) U.S. Cl. ....................................... 324/252; 335/209

(58) Field of Classification Search ................. 324/252; 335/209
See application file for complete search history.

(56) References Cited

OTHER PUBLICATIONS

A. Tulapurkar et al.; "Spin-torque diode effect in magnetic tunnel junctions;" Nature; vol. 438, 17; Nov. 17, 2005; pp. 339-342.

*Primary Examiner*—Reena Aurora
(74) *Attorney, Agent, or Firm*—Oliff & Berridge, PLC

(57) ABSTRACT

A magnetic device includes: a magnetoresistive effect element having a magnetization fixed layer, a magnetization free layer, and a nonmagnetic layer sandwiched between the magnetization fixed layer and the magnetization free layer; an input terminal for feeding an AC signal to the magnetoresistive effect element in its stacking direction; and an output terminal for extracting an output voltage from the magnetoresistive effect element, wherein the nomagnetic layer includes an insulating layer portion comprising an insulating material, and a current-constricting layer portion comprising a conductive material which passes through the insulating layer portion in its film thickness direction.

11 Claims, 26 Drawing Sheets

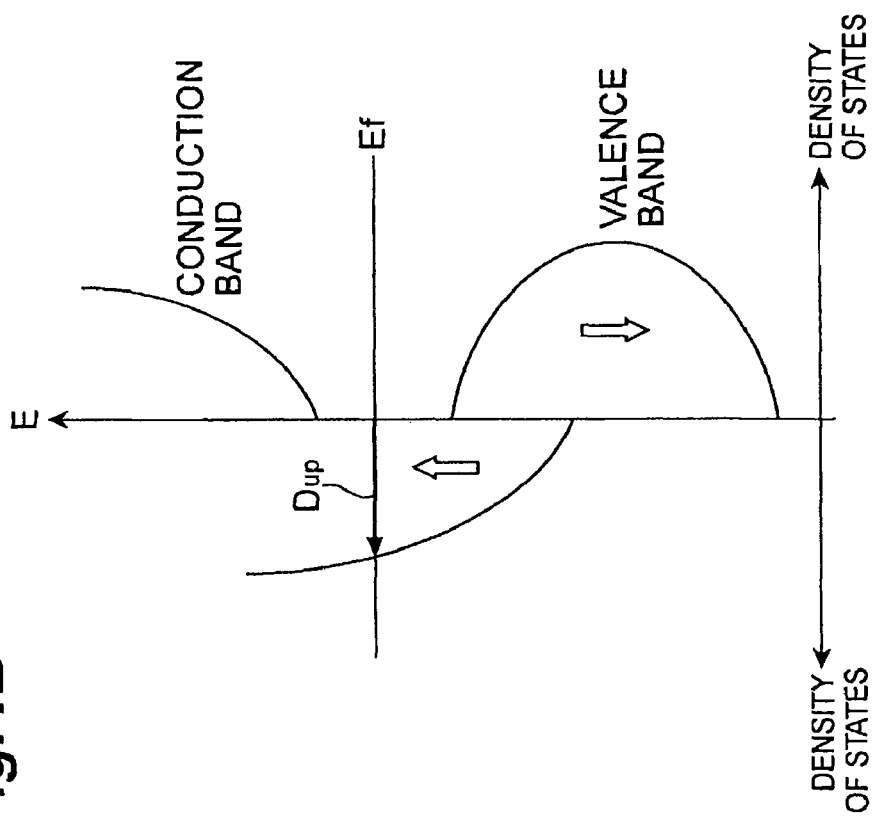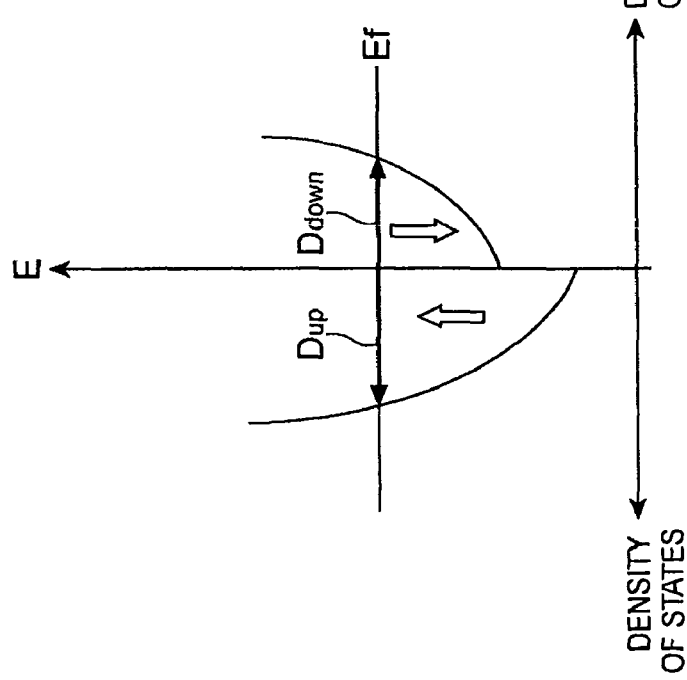

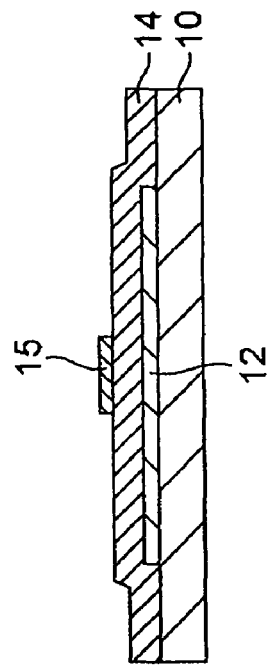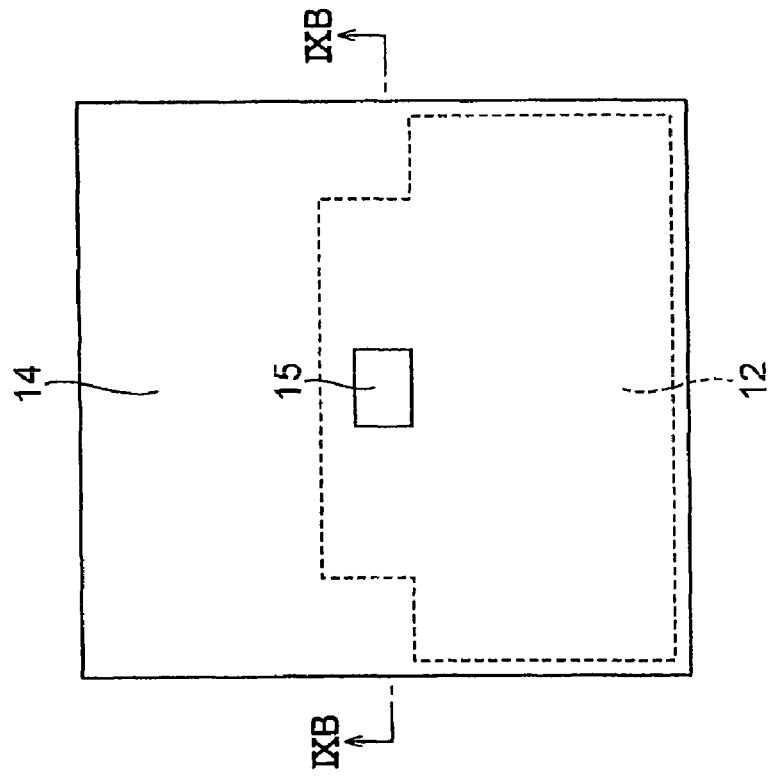

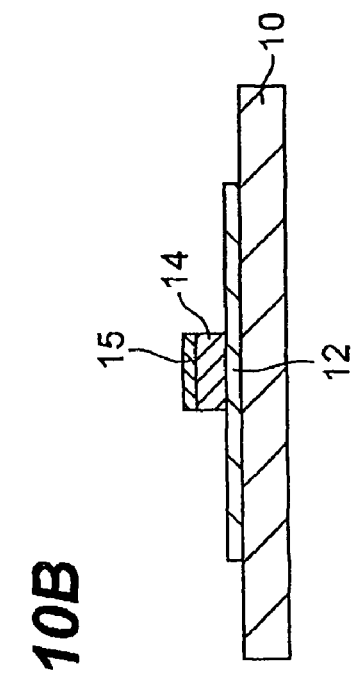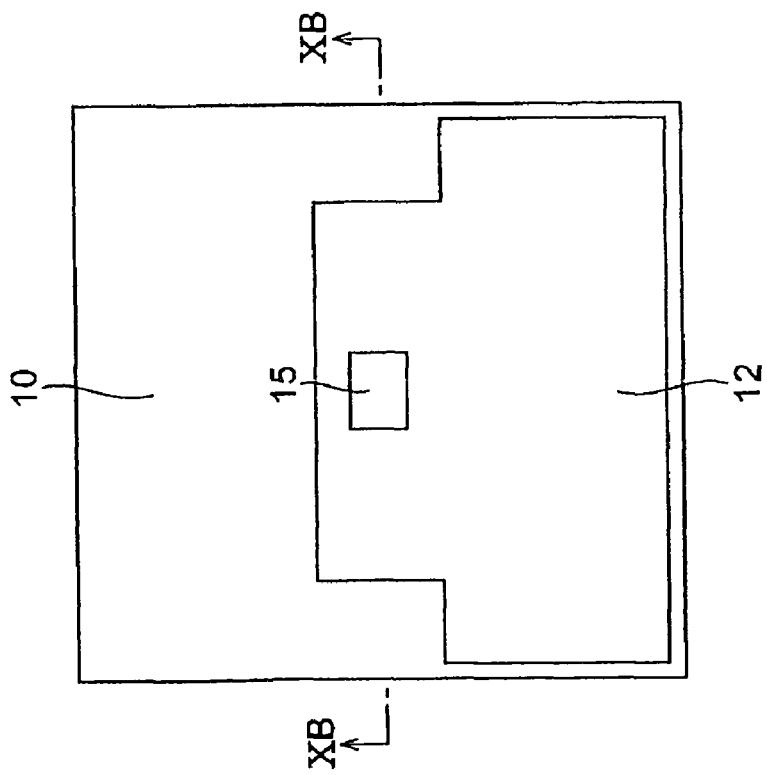

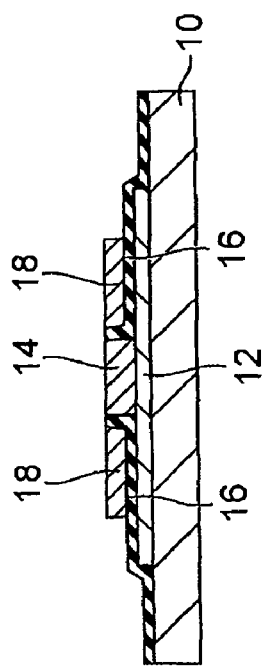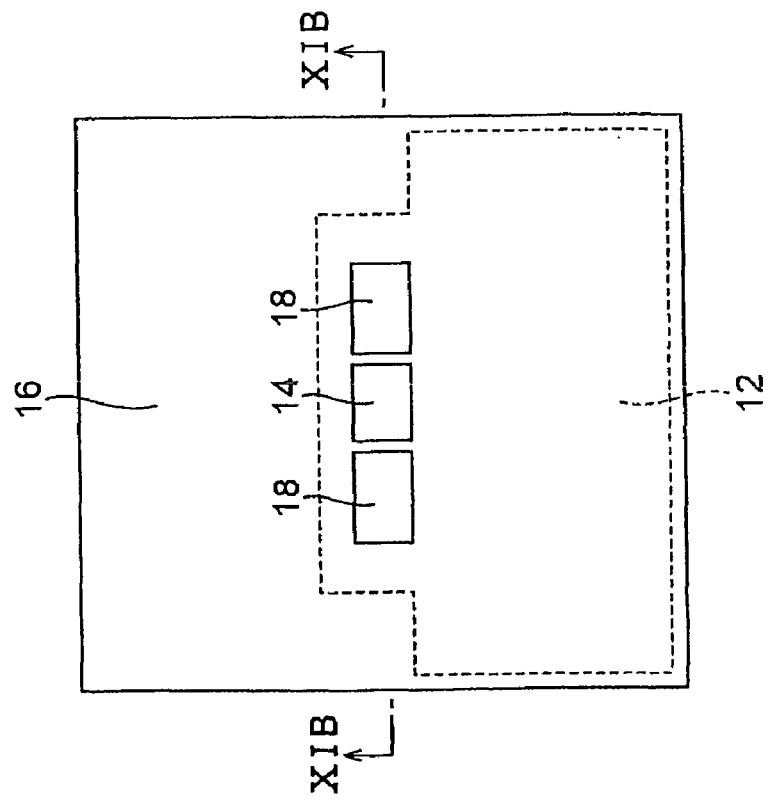

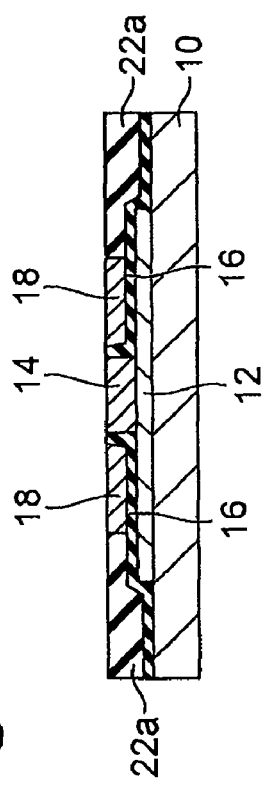
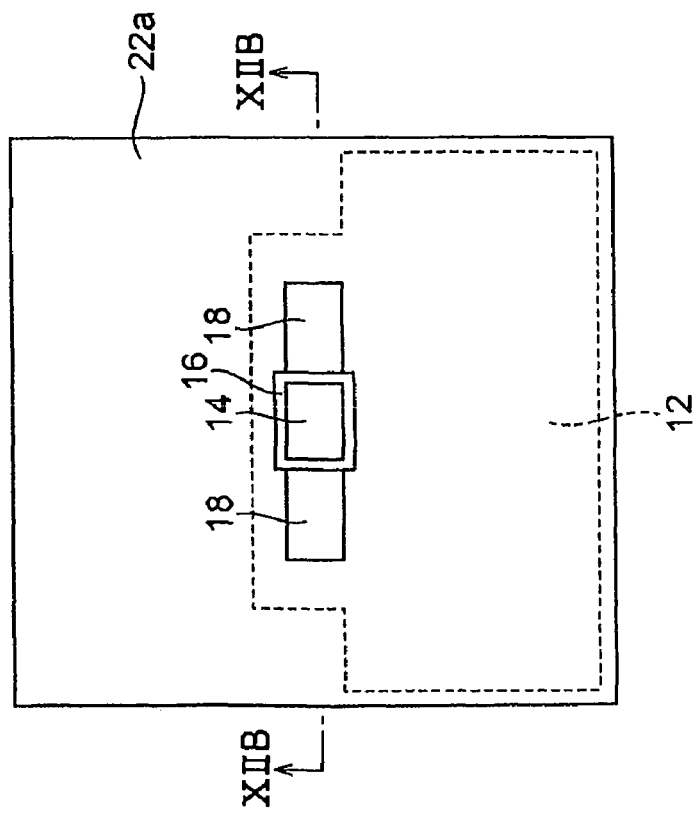
Fig.12A
Fig.12B

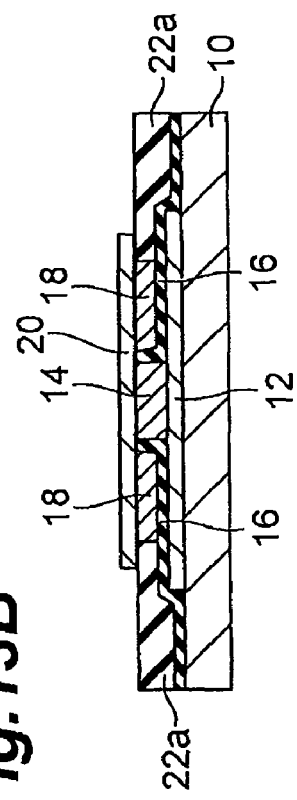
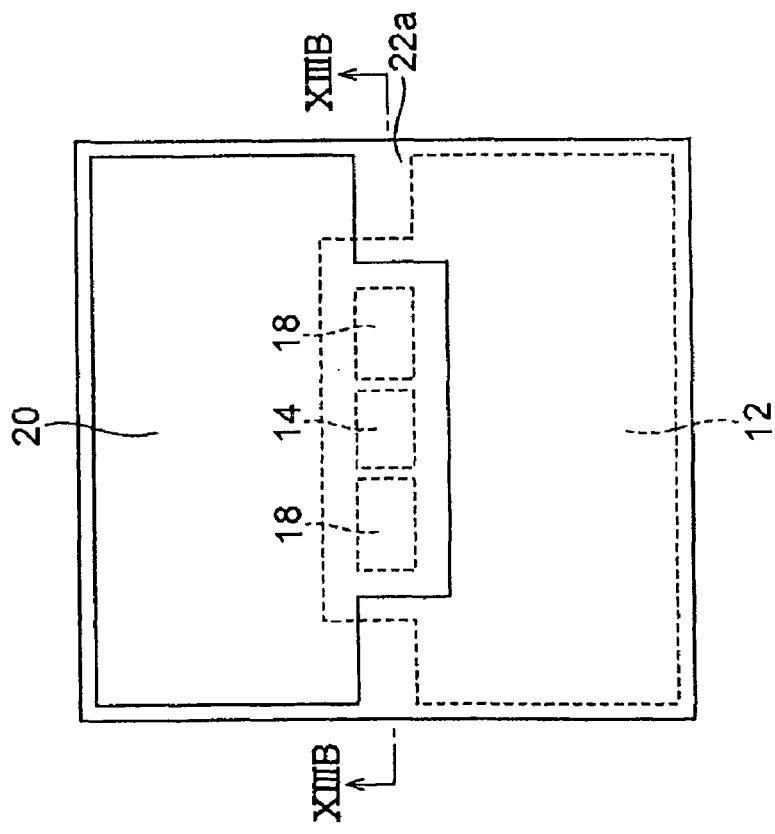
Fig.13B
Fig.13A

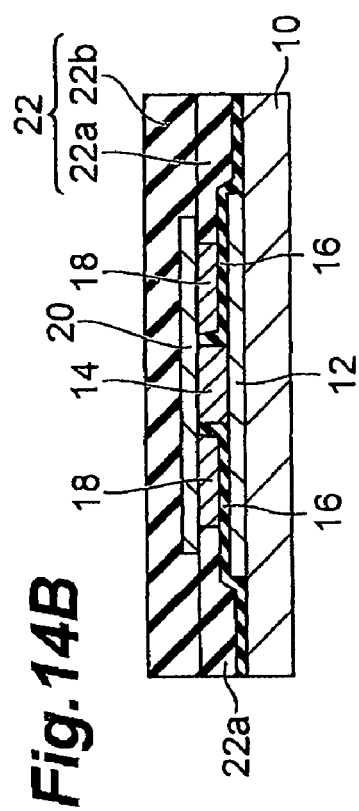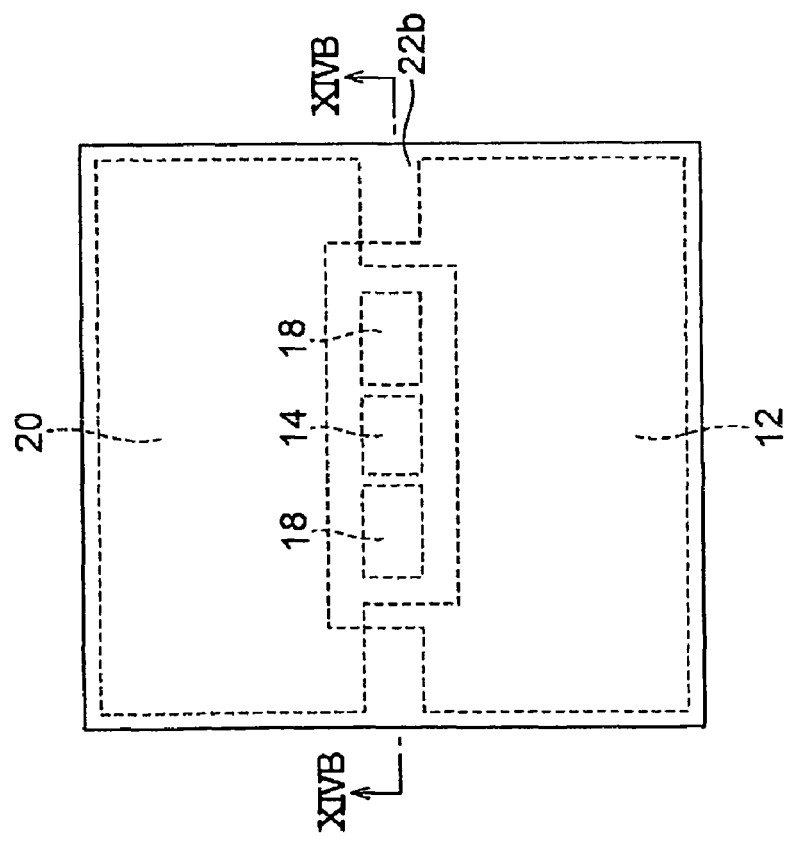

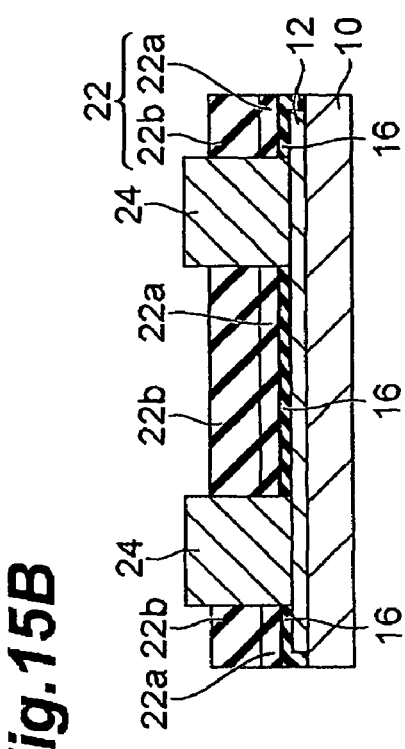
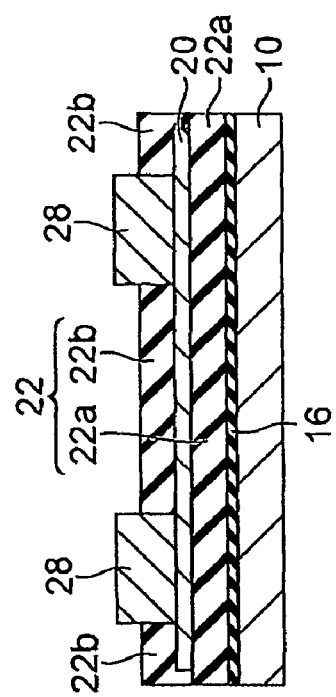
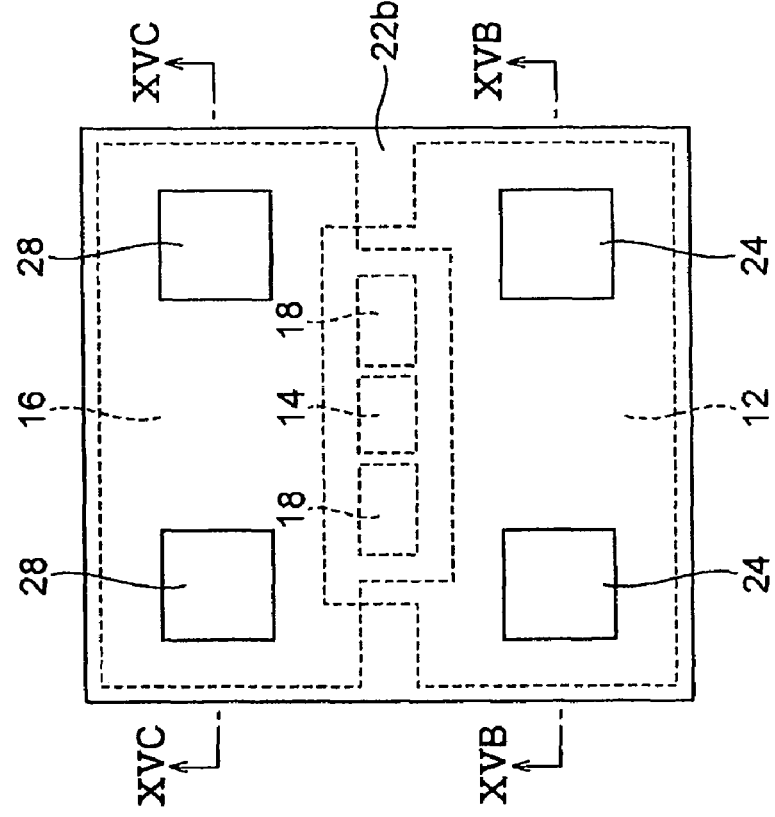

MAGNETIC DEVICE AND FREQUENCY DETECTOR

BACKGROUND OF THE INVENTION

1. Field of the Invention

The present invention relates to a magnetic device and a frequency detector.

2. Related Background of the Invention

As a magnetoresistive effect element, a GMR (Giant Magnetoresistive) element comprising a nonmagnetic conductive layer interposed between a fixed layer whose magnetization direction is fixed and a magnetization free layer whose magnetization direction varies freely is known. Moreover, as another magnetoresistive effect element, a TMR (Tunnel Magnetoresistive) element comprising a nonmagnetic insulating layer interposed between the fixed layer and the magnetization free layer is known. A current fed through such a magnetoresistive effect element provides a spin-polarized current, which then interacts with a spin accumulated within the magnetization free layer to generate a torque, and as a result the magnetization direction of the magnetization free layer will vary depending on the polarity of the spin-polarized current. In the magnetization free layer disposed within a certain magnetic field, even if attempting to change its magnetization direction, a torque will work in the magnetization direction so as to restore the magnetization direction to a stable direction constrained by the magnetic field. Movement of this magnetization direction is analogous to the swinging oscillation of a weight of a pendulum when the weight of the pendulum pulled by gravity is swung by a certain force, and this is called a precession movement.

Recently, a phenomenon has been discovered that a resonance occurs when the natural frequency of precession movement of this magnetization direction coincides with the frequency of an AC current flowing through the magnetization free layer (see Nature, Vol. 438, 17 November, 2005, pp. 339-342). The resistance value of the TMR element depends on the angle formed between the magnetization direction of the magnetization free layer and the magnetization direction of the fixed layer. If the resonance in the magnetization direction occurs in the magnetization free layer, the magnetization direction of the magnetization free layer will oscillate greatly and the resistance value of the TMR element will periodically vary greatly. On the other hand, if the resistance value of the TMR element varies greatly in synchronization with the input AC current, the AC current flowing between both ends of the TMR element will vary asymmetrically with respect to the zero level and accordingly have a DC component, and this varying portion can be extracted as an output (the spin torque diode effect).

SUMMARY OF THE INVENTION

When the magnetoresistive effect element exhibits the spin torque diode effect as described above, output DC voltage will have a peak in a specific frequency region of the input AC voltage. Then, in the magnetic device to which the spin torque diode effect is applied, a smaller half-value width of the peak of such output DC voltage is more preferable.

However, in the conventional magnetoresistive effect element exhibiting the spin torque diode effect, the half-value width of the peak of the output DC voltage is not sufficiently small and also the element structure for reducing the half-value width of the peak of the output DC voltage has not been known.

The present invention has been made in view of such problems. It is thus an object of the present invention to provide a magnetic device using the spin torque diode effect and having a sufficiently small half-value width of the peak of the output DC voltage, and a frequency detector using such a magnetic device.

In order to solve the above-described problems, a magnetic device according to the present invention comprises: a magnetoresistive effect element including a magnetization fixed layer, a magnetization free layer, and a nonmagnetic layer sandwiched between the magnetization fixed layer and the magnetization free layer, an input terminal for feeding an AC signal to the magnetoresistive effect element in its stacking direction, and an output terminal for extracting an output voltage from the magnetoresistive effect element, wherein the nonmagnetic layer includes an insulating layer portion comprising an insulating material, and a current-constricting layer portion comprising a conductive material which passes through the insulating layer portion in its film thickness direction.

According to the magnetic device of the present invention, a current fed through the magnetoresistive effect element provides a spin-polarized current, which generates a torque by the interaction between the magnetization free layer and spins accumulated within the magnetization free layer, and as a result the magnetization direction of the magnetization free layer will vary depending on the polarity of the spin-polarized current. Then, when the natural frequency of the magnetization direction of the magnetization free layer of the magnetoresistive effect element coincides with the frequency of an AC current flowing through the magnetoresistive effect element, the oscillation of the magnetization direction of the magnetization free layer will resonate. In this case, the resistance value of the magnetoresistive effect element depends on a relative angle between the magnetization direction of the magnetization free layer and the magnetization direction of the magnetization fixed layer. As a result, the resistance value of the magnetoresistive effect element will abruptly vary at this frequency and the output voltage will vary asymmetrically with respect to the zero level and have a DC component.

Then, in the magnetic device of the present invention, the current of the input AC signal, in passing through the nonmagnetic layer of the magnetoresistive effect element, cannot pass through the insulating layer portion of the nonmagnetic layer and thus will pass only through the current-constricting layer portion. For this reason, the half-value width of the peak of the output DC voltage becomes sufficiently small.

Furthermore, the magnetic device preferably further comprises a magnetic field applying portion that is provided so as to apply a magnetic field to the magnetization free layer.

This makes it possible to apply a predetermined magnitude of magnetic field to the magnetization free layer. Then, the natural frequency (resonance frequency) of the magnetization direction of the magnetization free layer is determined depending on the magnitude of the magnetic field applied to the magnetization free layer. Accordingly, a magnetic device can be obtained which outputs a DC component by selectively varying the voltage of a signal with a specific frequency corresponding to the component of the determined resonance frequency of the input AC signal.

Furthermore, the current-constricting layer portion preferably has a cross-section area of 0.00001 to 0.01 $\mu m^2$ on a plane perpendicular to its film thickness direction.

This reduces particularly the half-value width of the peak of the output DC voltage of the magnetic device.

Furthermore, it is preferable that at least one of the magnetization fixed layer and the magnetization free layer include a half metal layer. Furthermore, the half metal layer is preferably made of a Heusler alloy.

This can increase the output DC voltage of the magnetic device. That is, since the spin polarization ratio of the half metal such as a Heusler alloy at room temperature is approximately 100%, the magnetoresistive effect ratio of the magnetoresistive effect element will increase. For this reason, when the magnetization direction of the magnetization free layer resonates with the AC current flowing through the magnetoresistive effect element, the resistance value of the magnetoresistive effect element will vary more abruptly at this frequency. This results in an increase in the output DC voltage of the magnetic device.

Furthermore, it is preferable that among the frequency components contained in the AC signal, the frequency component corresponding to the natural frequency of the magnetization direction of the magnetization free layer resonate with the magnetization direction of the magnetization free layer, and vary the frequency component corresponding to the natural frequency to output a DC voltage. Accordingly, if the magnetic device is manufactured so that the natural frequency of the magnetization free layer may become a predetermined value, the magnetic device can be obtained which outputs a DC voltage by selectively varying the predetermined frequency component among the frequency components contained in the AC signal.

Furthermore, the magnetic device preferably comprises a plurality of magnetoresistive effect elements each having a different natural frequency and a plurality of output terminals for extracting output voltages from the plurality of magnetoresistive effect elements. This provides a magnetic device which, when the AC signal contains a plurality of frequency components, varies the plurality of frequency components corresponding to the plurality of natural frequencies and accordingly outputs a plurality of DC voltages, respectively.

Furthermore, the magnetic device preferably further comprises a signal generating device for generating the AC signal. This provides a magnetic device which processes the signal generated from the signal generating device.

Furthermore, the signal generating device is preferably an antenna. This provides a magnetic device which processes a signal received by the antenna.

A frequency detector according to the present invention comprises any of the above-described magnetic devices and a monitor circuit for monitoring the voltage output from the output terminal. According to the present invention, the voltage of a signal with a specific frequency of the input AC signal is detected by the monitor circuit. Accordingly, this device functions as a frequency detector. Furthermore, since the magnetic device having a sufficiently small half-value width of the peak of the output DC voltage as described above is used, a frequency detector with a high frequency resolution can be obtained.

Furthermore, the frequency detector preferably further comprises a low pass filter interposed between the monitor circuit and the magnetoresistive effect element. This allows only the DC component from the magnetoresistive effect element to transmit therethrough and enter the monitor circuit. That is, only the DC voltage of a signal with a specific frequency, the signal selectively varying among the AC signal, can be extracted by providing the low pass filter since the AC signal is applied between both ends of the magnetoresistive effect element.

According to the magnetic device and the frequency detector of the present invention, a magnetic device using the spin torque diode effect and having a sufficiently small half-value width of the peak of the output DC voltage, and a frequency detector using such a magnetic device can be provided.

BRIEF DESCRIPTION OF THE DRAWINGS

FIG. 4A is a density of states diagram of an ordinary ferromagnetic material.

FIG. 4B is a density of states diagram of a half metal.

FIG. 9A is a plan view of an intermediate body of the magnetic device 30.

FIG. 9B is an end view of the intermediate body of the magnetic device 30.

FIG. 10A is a plan view of an intermediate body of the magnetic device 30.

FIG. 10B is an end view of the intermediate body of the magnetic device 30.

FIG. 11A is a plan view of an intermediate body of the magnetic device 30.

FIG. 11B is an end view of the intermediate body of the magnetic device 30.

FIG. 12A is a plan view of an intermediate body of the magnetic device 30.

FIG. 12B is an end view of the intermediate body of the magnetic device 30.

FIG. 13A is a plan view of an intermediate body of the magnetic device 30.

FIG. 13B is an end view of the intermediate body of the magnetic device 30.

FIG. 14A is a plan view of an intermediate body of the magnetic device 30.

FIG. 14B is an end view of the intermediate body of the magnetic device 30.

FIG. 15A is a plan view of an intermediate body of the magnetic device 30.

FIG. 15B is an end view of the intermediate body of the magnetic device 30.

FIG. 15C is an end view of the intermediate body of the magnetic device 30.

DESCRIPTION OF THE PREFERRED EMBODIMENTS

Hereinafter, a magnetic device and a frequency detector according to embodiments will be described in detail with reference to the accompanying drawings. Note that, in each drawing, the same numeral is used for the same element and the duplicated description will be omitted. Moreover, dimensional ratios within a constituent element and between constituent elements in the accompanying drawings are arbitrary for ease of viewing the drawings, respectively.

Figure 1:
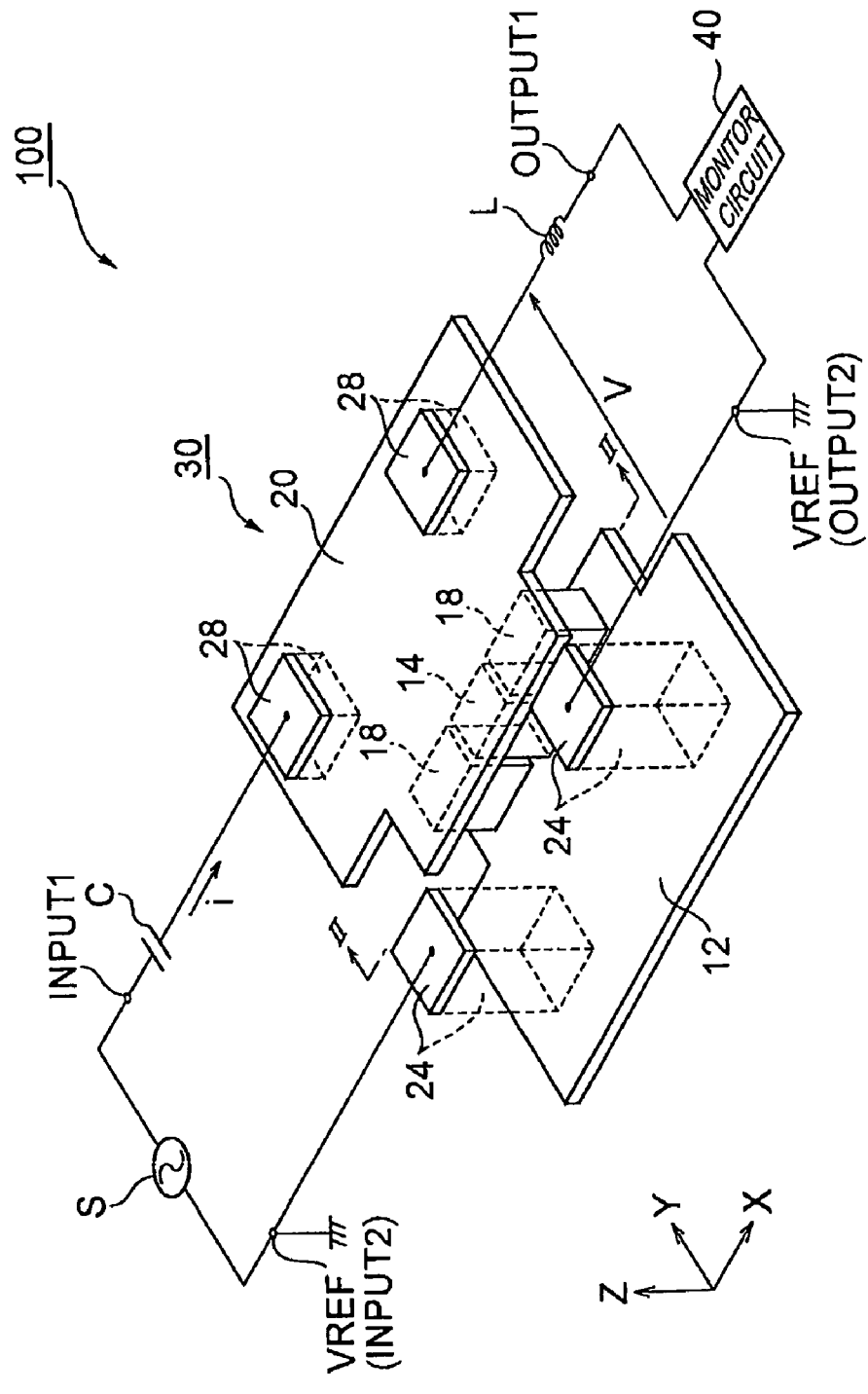
FIG. 1 is a perspective view of a frequency detector 100 comprising a magnetic device 30 according to the present invention.

FIG. 1 is a perspective view of a frequency detector 100 comprising a magnetic device 30 according to the present invention. Note that, in FIG. 1, for ease of viewing the drawing, the illustration of a silicon substrate 10, a separation layer 16, and a protective layer 22 described later are omitted (see FIG. 2).

The magnetic device 30 comprises a magnetoresistive effect element 14, a pair of bias magnetic field applying layers 18 as a magnetic field applying portion that is provided so as to apply a static magnetic field to the magnetoresistive effect element 14, a pair of input terminals INPUT1, INPUT2 for supplying an AC signal i between both ends of the magnetoresistive effect element 14, and a pair of output terminals OUTPUT1, OUTPUT2 for extracting an output voltage V between both ends of the magnetoresistive effect element 14. Note that the input terminal INPUT2 and the output terminal OUTPUT2 are reference terminals VREF and connected to the ground.

The stacking direction of the magnetoresistive effect element 14 is set in the Z-axis direction, and two axes perpendicular thereto are set in the X-axis and the Y-axis, respectively. At positions spaced apart relative to the magnetoresistive effect element 14 in the X-axis direction which is one of the film surface directions (XY plane directions) of the magnetoresistive effect element 14, the pair of bias magnetic field applying layers 18 are provided so as to sandwich the magnetoresistive effect element 14. An upper electrode layer 20 and a lower electrode layer 12 are in contact with both ends of the magnetoresistive effect element 14 in the Z-axis direction, respectively, and are electrically connected to the magnetoresistive effect element 14. The upper electrode layer 20 and the lower electrode layer 12 are tabular electrodes having a projected portion, respectively, and the magnetoresistive effect element 14 is disposed between the respective projected portions. Note that the terms of "upper portion" and "lower portion" mean a position on the positive side and a position on the negative side of the Z-axis, respectively, and are independent of the direction of gravity.

A pair of pads 28 for the upper electrode layer and a pair of pads 24 for the lower electrode layer are electrically connected to the upper electrode layer 20 and the lower electrode layer 12, respectively. Note that, a part of the pads 28 for the upper electrode layer and a part of the pads 24 for the lower electrode layer are buried in a protective layer 22 (not shown in FIG. 1, and see FIG. 2), respectively, and the portions buried in the protective layer 22 among the pads 28 for the upper electrode layer and the pads 24 for the lower electrode layer are indicated with broken lines in FIG. 1.

Between one of the pads 28 for the upper electrode layer and one of the pads 24 for the lower electrode layer, an AC signal i is applied from a signal source S via the input terminals INPUT1, INPUT2. That is, the AC signal i flows through the magnetoresistive effect element 14 in its stacking direction. Moreover, a capacitor C is inserted in series with a wiring between the input terminal INPUT1 and one of the pads 28 for the upper electrode layer so that a direct current may not be applied between one of the pads 28 for the upper electrode layer and one of the pads 24 for the lower electrode layer.

Figure 2:
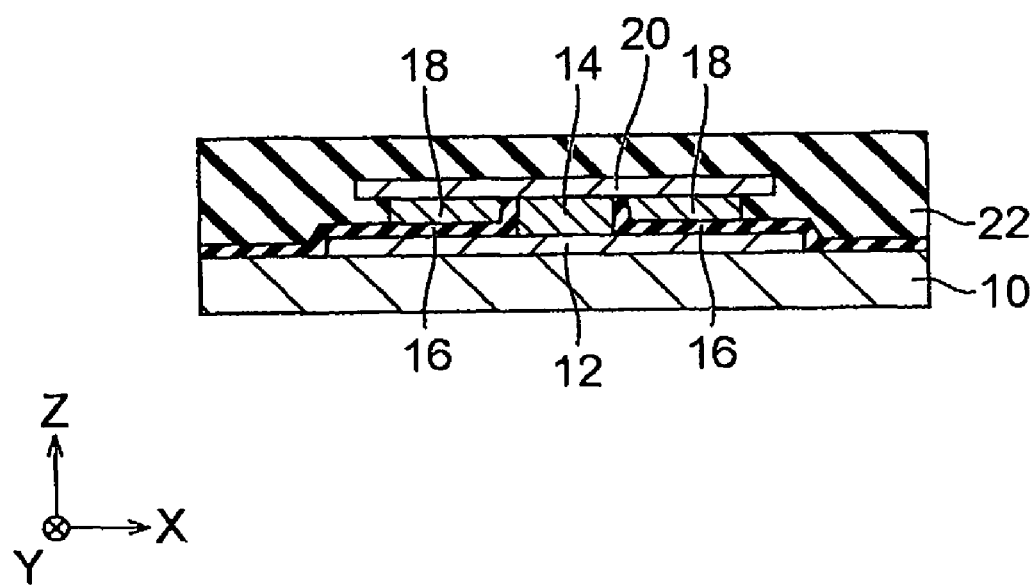
FIG. 2 is an end view of the magnetic device 30 along a II-II line in FIG. 1.

FIG. 2 is an end view of the magnetic device 30 along a II-II line in FIG. 1. As shown in FIG. 2, the lower electrode layer 12, the magnetoresistive effect element 14, and the upper electrode layer 20 are stacked above the silicon substrate 10 in this order. Moreover, the pair of bias magnetic field applying layers 18 are provided so as to sandwich the magnetoresistive effect element 14 at positions spaced apart in the X-axis direction relative to the magnetoresistive effect element 14. Then, the separation layer 16 comprising an insulating material is provided between the pair of bias magnetic field applying layers 18 and the magnetoresistive effect element 14 and between the pair of bias magnetic field applying layers 18 and the lower electrode layer 12. Accordingly, the upper electrode layer 20 and the lower electrode layer 12 are electrically connected to each other only via the magnetoresistive effect element 14. Furthermore, the protective layer 22 is formed so as to cover the upper electrode layer 20, the pair of bias magnetic field applying layers 18, and the separation layer 16.

Figure 3:
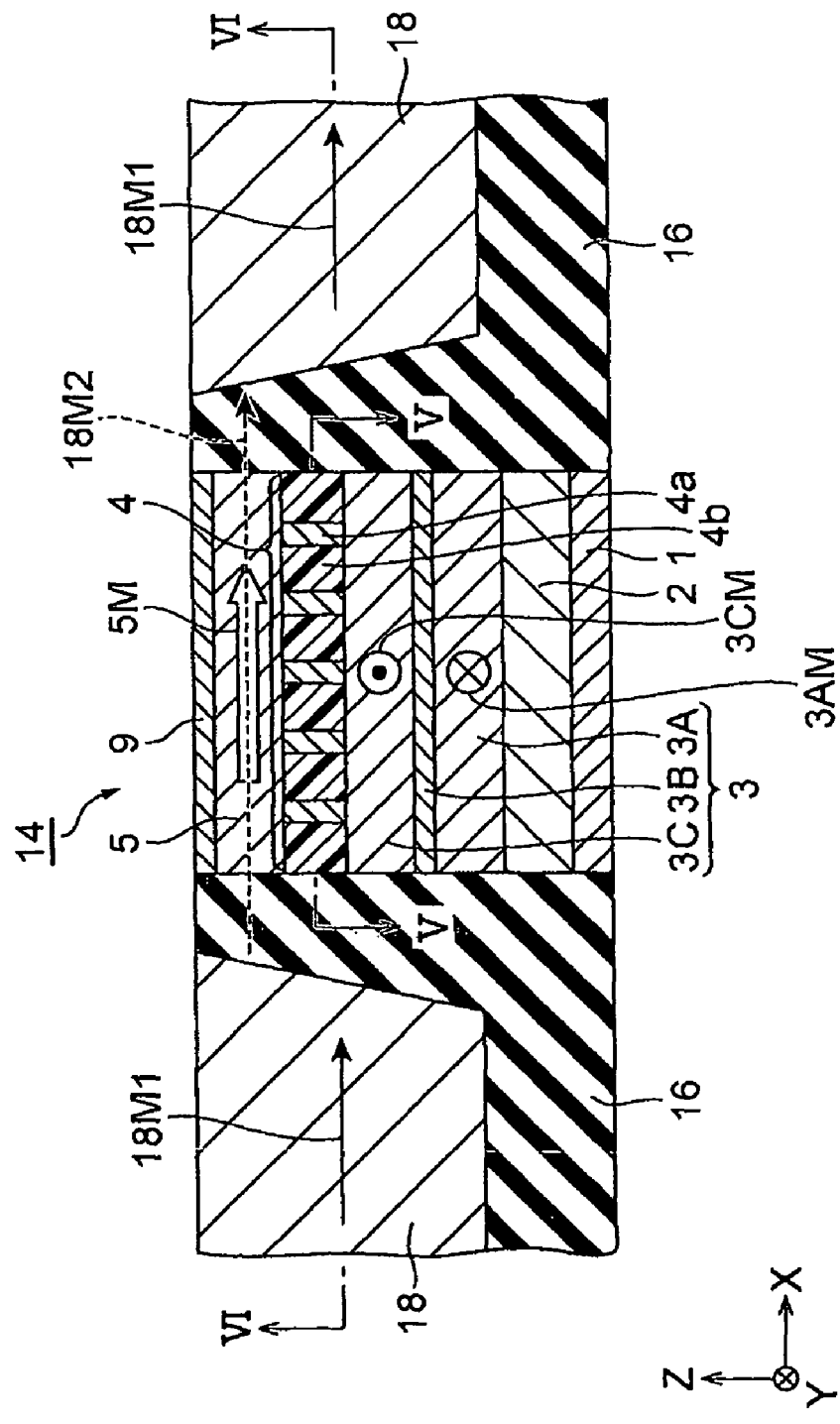
FIG. 3 is an enlarged end view in the vicinity of a magnetoresistive effect element 14 of FIG. 2.
Figure 5:
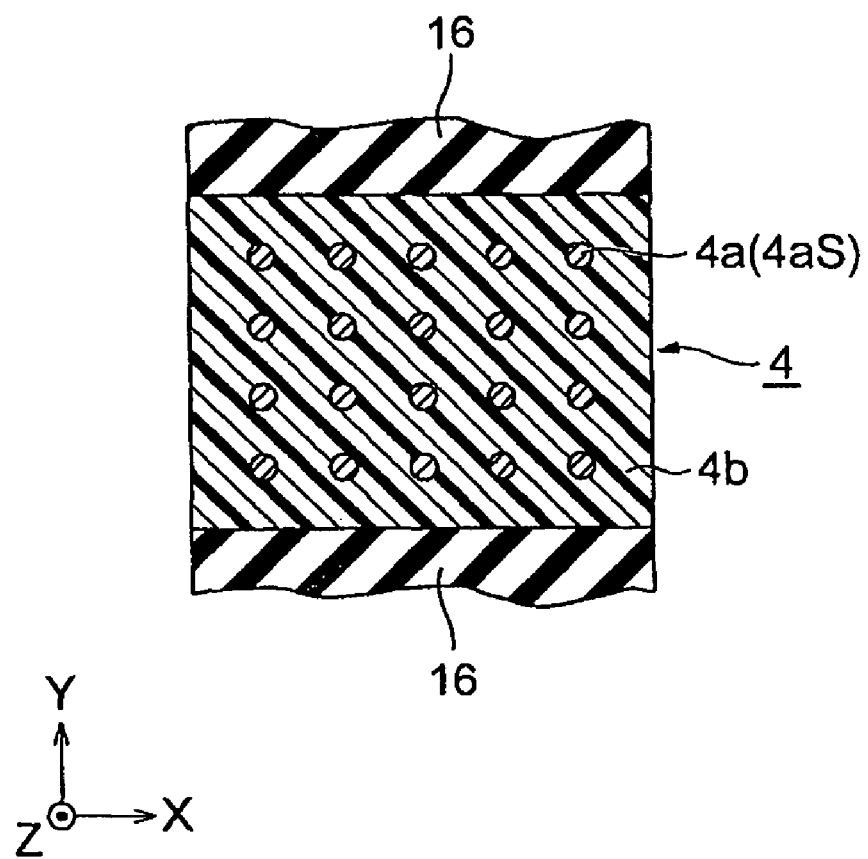
FIG. 5 is an end view of the magnetoresistive effect element 14 along a V-V line of FIG. 3.
Figure 6:
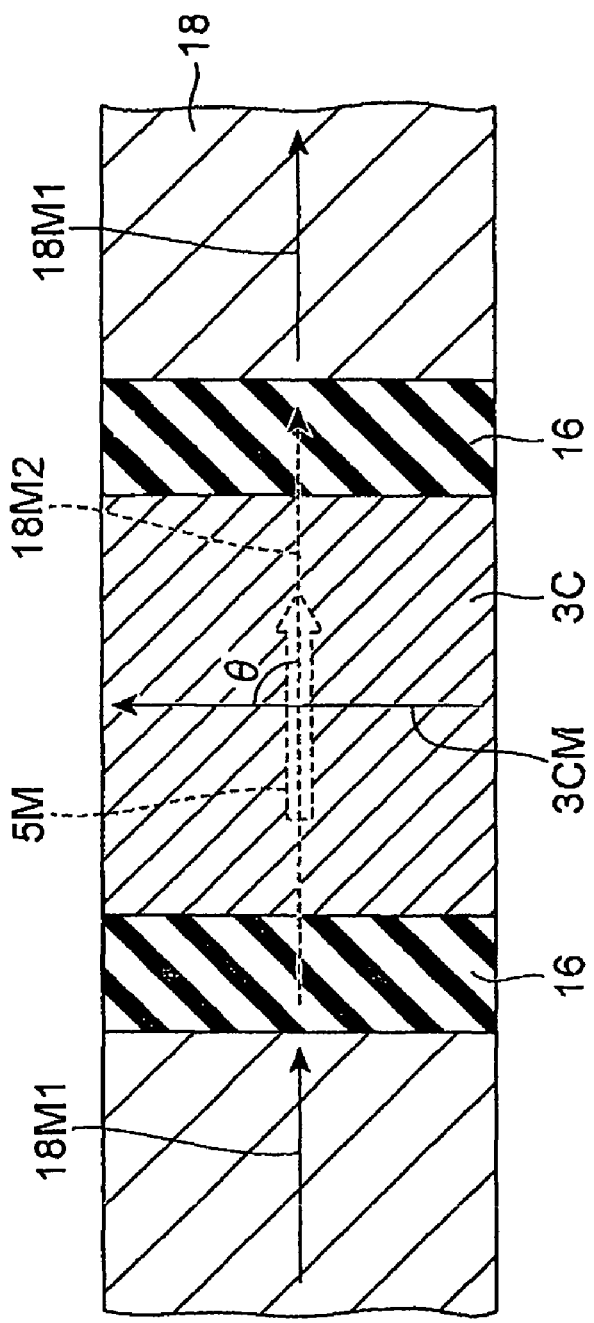
FIG. 6 is an end view of the magnetoresistive effect element 14 along a VI-VI line of FIG. 3.

The details of the magnetoresistive effect element 14, the separation layer 16, and the pair of bias magnetic field applying layers 18 are described using FIG. 3, FIG. 5 and FIG. 6. FIG. 3 is an enlarged end view in the vicinity of the magnetoresistive effect element 14 of FIG. 2, FIG. 5 is an end view of the magnetoresistive effect element 14 along a V-V line of FIG. 3, and FIG. 6 is an end view of the magnetoresistive effect element 14 along a VI-V1 line of FIG. 3.

As shown in FIG. 3, the magnetoresistive effect element 14 comprises the magnetization fixed layer 3, the magnetization free layer 5, and the nonmagnetic layer 4 sandwiched between the magnetization fixed layer 3 and the magnetization free layer 5. Specifically, the magnetoresistive effect element 14 comprises: an underlayer 1, an antiferromagnetic layer 2; a lower ferromagnetic layer 3A which is exchange-coupled to the antiferromagnetic layer 2 and the magnetization direction 3AM of which is fixed in the positive direction of the Y-axis; a nonmagnetic intermediate layer 3B comprising a conductive metal such as Ru; an upper ferromagnetic layer 3C whose magnetization direction 3CM is fixed in the direction opposite (in the negative direction of the Y-axis) to the magnetization direction 3AM of the lower ferromagnetic layer 3A via the nonmagnetic intermediate layer 3B; a nonmagnetic layer 4; a magnetization free layer 5 comprising a ferromagnetic material; and a cap layer 9 which are stacked in this order. Here, although the lower ferromagnetic layer 3A, the nonmagnetic intermediate layer 3B, and the upper ferromagnetic layer 3C constitute the magnetization fixed layer 3, the magnetization direction of the magnetization fixed layer 3 means the magnetization direction 3CM of the upper ferromagnetic layer 3C closer to the magnetization free layer 5 out of two ferromagnetic layers of the magnetization fixed layer 3. Note that the magnetoresistive effect element 14 may not have the underlayer 1 or/and the cap layer 9.

Ferromagnetism is magnetism of a material the adjacent spins of which are aligned toward the same direction and which has a large magnetic moment as a whole, and the ferromagnetic material has spontaneous magnetization even in the absence of an external magnetic field. The materials exhibiting ferromagnetism at room temperature include Fe, Co, Ni, and Gd. As the ferromagnetic material constituting the lower ferromagnetic layer 3A, the upper ferromagnetic layer 3C, and the magnetization free layer 5, for example, Co, NiFe alloy, a CoFe alloy, or the like can be used, however, it is preferable that at least one of the lower ferromagnetic layer 3A, the upper ferromagnetic layer 3C, and the magnetization free layers 5 be a layer comprising a half metal. As the half metal, for example, Heusler alloys such as $Co_2MnSi$, zincblende type compounds such as CrAs and CrSb, perovskite type Mn oxides such as $La_{0.7}Sr_{0.3}MnO_3$ can be used. As the Heusler alloy, an alloy expressed by $X_2YZ$ (where, X is either of Fe, Co, and Ni, and Y is either of V, Cr, and Mn, and Z is either of Al, Si, Ga, Ge, and Sn) is suitable. Moreover, as the half metal, a Heusler alloy with a $L2_1$ or B2 structure which is an ordered structure is suitable from the viewpoint of practical use because its Curie temperature is not lower than room temperature.

The half metal is a material whose spin polarization ratio becomes approximately 100%. FIG. 4A shows the density of states diagram of an ordinary ferromagnetic material (CoFe alloy or the like), and FIG. 4B shows the density of states diagram of a half metal. In FIG. 4A and FIG. 4B, the vertical axis represents energy and the horizontal axis represents the density of states of electrons, where the up-spin density of states is shown on the left side of the vertical axis and the down-spin density of states is shown on the right side of the vertical axis. In the case of the ordinary ferromagnetic material, as shown in FIG. 4A, there is a difference between the up-spin density of states Dup and the down-spin density of states Ddown in the vicinity of the Fermi level Ef. Therefore, the spin polarization ratio P defined as P=(Dup−Ddown)/(Dup+Ddown)×100 [%] becomes 0<P<100 [%]. On the other hand, in the case of the half metal, as shown in FIG. 4B, in the vicinity of the Fermi level Ef, only the up-spin has the density of states Dup and the down-spin does not have any density of states. For this reason, the spin polarization ratio P defined as described above becomes 100 [%].

As the antiferromagnetic material constituting the antiferromagnetic layer 2, FeMn, IrMn, PtMn, NiMn, or the like can be used.

Moreover, the film thickness of the magnetization free layer 5 can be set to 1 to 10 nm, for example, and the entire film thickness of the magnetoresistive effect element 14 can be set to 10 to 100 nm, for example.

Moreover, as shown in a FIG. 3 and FIG. 5, the nonmagnetic layer 4 includes a plurality of current-constricting layer portions 4a comprising a conductive material and an insulating layer portion 4b comprising an insulating material. Then, the current-constricting layer portion 4a passes through the insulating layer portion 4b in its film thickness direction (in the direction along the Z-axis). Therefore, in passing through the nonmagnetic layer 4, the AC signal i (see FIG. 1) flowing through the magnetoresistive effect element 14 in its stacking direction cannot pass through the insulating layer portion 4b but passes through only the current-constricting layer portion 4a. Therefore, as compared with a case where the whole nonmagnetic layer 4 of the magnetoresistive effect element 14 is formed of a conductive metal, that is, as compared with a case where the magnetoresistive effect element 14 is an ordinary CPP (Current Perpendicular to Plane) type GMR element, the path of the current passing through the nonmagnetic layer 4 is restricted to a specific region where the current-constricting layer portion 4a is formed. The current-constricting layer portion 4a preferably has one cross-section area 4aS of 0.00001 to 0.01 $\mu m^2$ on the plane (XY plane) perpendicular to its film thickness direction (the direction along the Z-axis). Moreover, the film thickness of the nonmagnetic layer 4 can be set to 0.5 to 3 nm, for example. As the material constituting the current-constricting layer portion 4a, for example, Cu, Au, Ag, or Ru can be used while as the material constituting the insulating layer portion 4b, for example, $Al_2O_3$, $SiO_2$, $TiO_2$, $HfO_2$, or MgO can be used.

Moreover, as shown in FIG. 3, the pair of bias magnetic field applying layers 18 as the magnetic field applying portion are provided at positions that are spaced apart in the X-axis direction relative to the magnetoresistive effect element 14 so as to sandwich the magnetization free layer 5. The bias magnetic field applying layer comprises a hard magnetic material such as CoCrPt, and is magnetized so that the direction of residual magnetization 18M1 thereof may face the X-axis direction of FIG. 3. Therefore, the bias magnetic field applying layer 18 autonomously generates a static magnetic field 18M2 in the X-axis direction of FIG. 3, and the static magnetic field 18M2 is applied to the magnetization free layer 5 as the bias magnetic field. As a result, the magnetization direction 5M of the magnetization free layer 5 will face the direction within the magnetization free layer 5 of the static magnetic field 18M2, i.e., the X-axis direction. Moreover, although the thickness of the bias magnetic field applying layer 18 is adjusted so that a resonant frequency $f_0$ may become a predetermined value as described later, it can be set to 1 to 100 nm, for example.

Moreover, as shown in FIG. 6, an angle θ formed between the direction within the magnetization free layer 5 of the static magnetic field 18M2 and the magnetization direction 3CM of the magnetization fixed layer 3 within the film surface of the magnetization fixed layer 3 is 90 degrees in the case of this embodiment. Although the angle θ may be an angle other than 90 degrees, the angle θ is preferably no less than 5 degrees from the viewpoint of easily oscillating the magnetization direction 5M of the magnetization free layer 5 as described later.

Next, the operations of the magnetic device and the frequency detector will be described using FIG. 1 to FIG. 3.

When the AC signal i is supplied to the magnetoresistive effect element 14, a spin with a specific polarity will be injected into the magnetization free layer 5 of the magnetoresistive effect element 14, and the magnetization direction 5M of the magnetization free layer 5 will vary in accordance with this injected amount. The magnetization direction 5M of the magnetization free layer 5, while the AC signal i is not supplied, coincides with the direction of the static magnetic field 18M2 generated from the bias magnetic field applying layer 18 within the magnetization free layer 5. When the polarized spin is injected into the magnetization free layer 5 from the magnetization fixed layer 3 side of the magnetoresistive effect element 14, a spin with a polarity whose magnetization direction is aligned with the magnetization direction 3CM of the upper ferromagnetic layer 3C will be injected into the magnetization free layer 5, and the magnetization free layer 5 is subjected to a torque which rotates the magnetization direction 5M of the magnetization free layer 5 in the direction parallel to the magnetization direction 3CM of the upper ferromagnetic layer 3C. When an electron is injected into the magnetization free layer 5 in the direction opposite to the above-described direction, a spin with a polarity whose magnetization direction is aligned with the magnetization direction 3CM of the upper ferromagnetic layer 3C will not be injected into the magnetization free layer 5, and therefore, a spin with a polarity opposite to the above-described one is injected into the magnetization free layer 5, and the magnetization free layer 5 is subjected to a torque which rotates the magnetization direction 5M of the magnetization free layer 5 in the direction antiparallel to the magnetization direction 3CM of the upper ferromagnetic layer 3C.

Since the polarity of the AC signal i varies with time, the magnetization direction 5M of the magnetization free layer 5 will oscillate under the influence of the magnitude and frequency of the AC signal i. When a natural frequency $f_F$ of the magnetization direction 5M of the magnetization free layer 5 of the magnetoresistive effect element 14 coincides with the frequency f of the AC signal i flowing through the magnetoresistive effect element 14 ($f_0=f_F=f$), the oscillation of the magnetization direction 5M of the magnetization free layer 5 will resonate. In this case, the resistance value of the magnetoresistive effect element 14 depends on a relative angle between the magnetization direction 5M of the magnetization free layer 5 and the magnetization direction 3CM of the magnetization fixed layer 3. As a result, the element resistance value of the magnetoresistive effect element 14 will vary abruptly at this frequency, and the voltage of the AC signal i will vary to have a DC component, which is then output as a voltage V between the output terminals OUTPUT1, OUTPUT2 connected to the other pad 28 for the upper electrode layer and the other pad 24 for the lower electrode layer, respectively.

Figure 7:
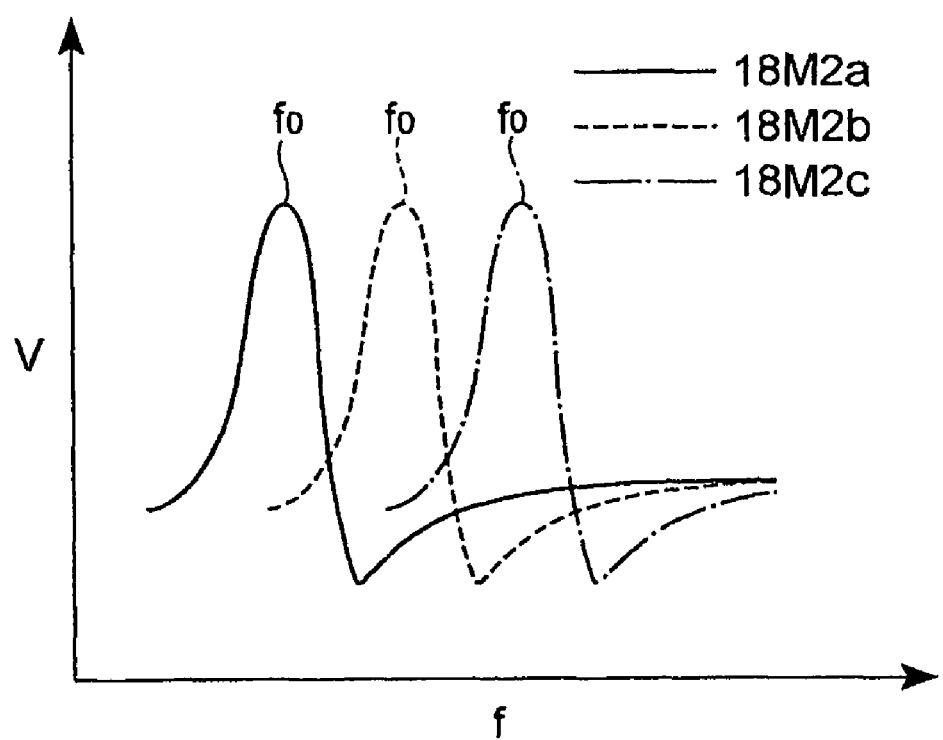
FIG. 7 is a graph showing a relationship between the frequency f of an AC signal i and an output voltage V.
Figure 8:
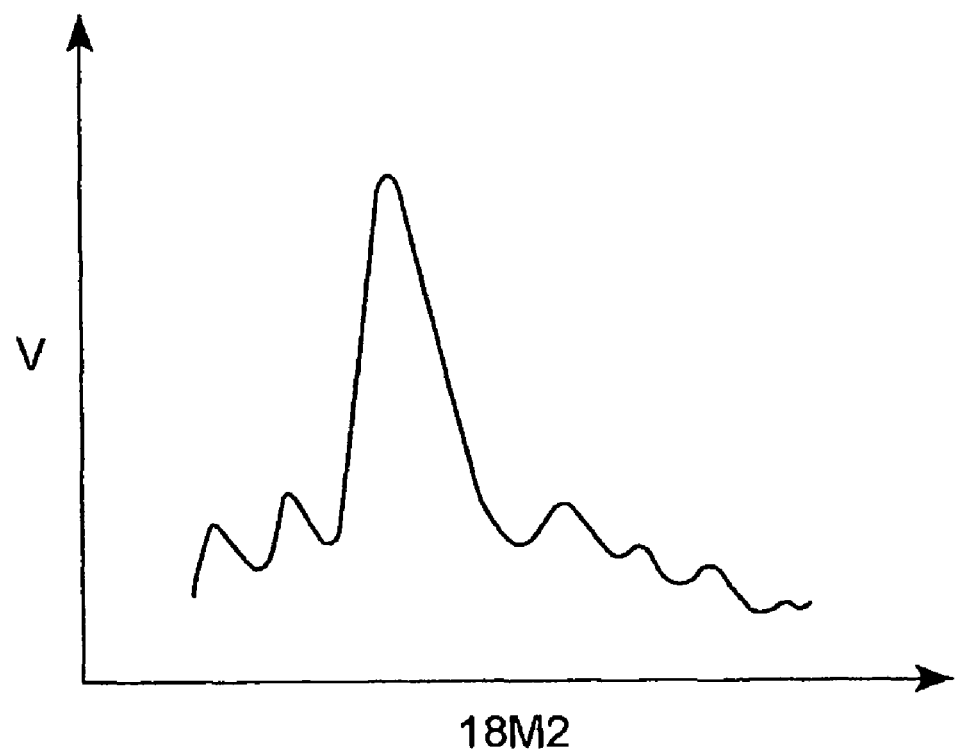
FIG. 8 is a graph showing a relationship between a static magnetic field 18M2 and the voltage V.

The resonant frequency $f_0$ (natural frequency $f_F$) depends on the magnitude of the static magnetic field 18M2 applied to the magnetization free layer 5 of the magnetoresistive effect element 14, and increases as the static magnetic field 18M2 increases. The magnitude of the static magnetic field 18M2 depends on the quality of the material, film thickness, and the like of the bias magnetic field applying layer 18. When these conditions are adjusted to increase the magnitude of the static magnetic field 18M2 (18M2a<18M2b<18M2c), the resonant frequency $f_0$ will increase (see FIG. 7). That is, depending on the quality of the material, film thickness, and the like of the bias magnetic field applying layer 18, the resonant frequency $f_0$ is determined and the voltage V corresponding to the component of the resonant frequency $f_0$ determined of the input AC signal i will selectively vary to have a DC component, which then appears between the output terminals OUTPUT1, OUTPUT2 (see FIG. 8).

Moreover, the frequency detector 100 of this embodiment comprises the magnetic device 30 and further comprises a monitor circuit 40 which monitors the voltage V output from the output terminals OUTPUT1, OUTPUT2. When the AC signal i is supplied to the magnetoresistive effect element 14, the voltage V of the specific resonant frequency $f_0$ corresponding to the natural frequency $f_F$ of the magnetization free layer 5 will be detected by the monitor circuit 40 (see FIG. 8). That is, the frequency detector 100 of this embodiment functions as a frequency detector which detects a specific frequency contained in the AC signal i.

Moreover, the frequency detector 100 further comprises a low pass filter L interposed between the monitor circuit 40 and the magnetoresistive effect element 14. This is because only the DC voltage of a signal voltage with a specific frequency corresponding to the natural frequency $f_F$ of the magnetization direction 5M of the magnetization free layer 5 is selectively extracted from the output terminals OUTPUT1, OUTPUT2, since the AC signal i is applied to the input terminals INPUT1, INPUT2 although the pair of input terminals INPUT1, INPUT2 and the pair of output terminals OUTPUT1, OUTPUT2 are connected between both ends of the magnetoresistive effect element 14, respectively. The low pass filter L allows only the DC component from the magnetoresistive effect element 14 to pass therethrough and enter the monitor circuit 40. In this embodiment, the low pass filter L comprises a coil interposed between the pad 28 for the upper electrode layer and the output terminal OUTPUT1.

Next, a method of manufacturing the magnetic device 30 according to this embodiment will be described using FIG. 9A to FIG. 19. FIG. 9A, FIG. 10A, FIG. 11A, FIG. 12A, FIG. 13A, FIG. 14A, and FIG. 15A are plan views of an intermediate body of the magnetic device 30. Moreover, FIG. 9B, FIG. 10B, FIG. 11B, FIG. 12B, FIG. 13B, and FIG. 14B are end views of the intermediate body of the magnetic device 30 along a predetermined line in FIG. 9A, FIG. 10A, FIG. 11A, FIG. 12A, FIG. 13A, and FIG. 14A, respectively, and FIG. 15B and FIG. 15C are end views of the intermediate body of the magnetic device 30 along predetermined lines in FIG. 15A, respectively.

First, as shown in FIG. 9A and FIG. 9B, the lower electrode layer 12 comprising a conductive material such as Cu, the lower electrode layer 12 being patterned in a predetermined shape, is formed above the silicon substrate 10, and the magnetoresistive effect element 14 is formed above this whole surface, and then a patterned resist mask 15 is formed in a portion where the magnetoresistive effect element 14 is to be left in future. Here, the lower electrode layer 12 and the magnetoresistive effect element 14 can be deposited using a sputtering apparatus, for example. The details of the method of forming the magnetoresistive effect element 14 will be described later.

Subsequently, as shown in FIG. 10A and FIG. 10B, in the magnetoresistive effect element 14, a portion which is not masked with the resist mask 15 is removed by ion milling or the like. The pattern of the magnetoresistive effect element 14 is thus formed.

Next, as shown in FIG. 11A and FIG. 11B, the separation layer 16 comprising $SiO_2$ or the like is formed on the side face of the magnetoresistive effect element 14 and on the exposed surfaces of the lower electrode layer 12 and silicon substrate 10, and then, the pair of bias magnetic field applying layers 18, which are patterned so as to be spaced apart from the magnetoresistive effect element 14, are formed on both side faces of the magnetoresistive effect element 14. Here, the separation layer 16 can be formed with a CVD apparatus using $Si(OC_2H_5)_4$, for example.

Then, as shown in FIG. 12A and FIG. 12B, the protective layer 22a comprising Ta or the like is deposited on this whole surface, and afterward, this surface is lapped with CMP or the like until the magnetoresistive effect element 14 and the bias magnetic field applying layer 18 are exposed, and thereby the protective layer 22a is filled in the recess to planarize the whole surface.

Subsequently, as shown in FIG. 13A and FIG. 13B, the upper electrode layer 20 comprising a conductive material such as Cu, the upper electrode layer 20 being patterned in a predetermined shape, is formed so as to electrically contact to the magnetoresistive effect element 14.

Next, as shown in FIG. 14A and FIG. 14B, after forming the protective layer 22b comprising $SiO_2$ or the like on the whole surface, the resultant surface is planarized by lapping using CMP or the like.

Then, as shown in FIG. 15A, FIG. 15B, and FIG. 15C, regions except regions where the pads 28 for the upper electrode layer and the pads 24 for the lower electrode layer are to be formed in future in the surface of the protective layer 22 (=protective layer 22a+protective layer 22b) are masked with a resist, and the protective layer 22 in the non-masked region is removed, for example, with a reactive ion etching apparatus using $C_4F_8$ or the like to form through-holes that reach the upper electrode layer 20 and the lower electrode layer 12. Then, a conductive material such as Au is deposited into the through-holes with a sputtering apparatus or the like to form the pair of pads 28 for the upper electrode layer and the pads 24 for the lower electrode layer. Then, as shown in FIG. 1, the pair of input terminals INPUT1, INPUT2 are connected to one of the pair of pads 28 for the upper electrode layer and one of the pair of pads 24 for the lower electrode layer, and the pair of output terminals OUTPUT1, OUTPUT2 are connected to the other pad of the pair of pads 28 for the upper electrode layer and the other pad of the pads 24 for the lower electrode layer, thereby completing the magnetic device 30.

Next, the details of the method of forming the magnetoresistive effect element 14 will be described using FIG. 16 to FIG. 19.

Figure 16:
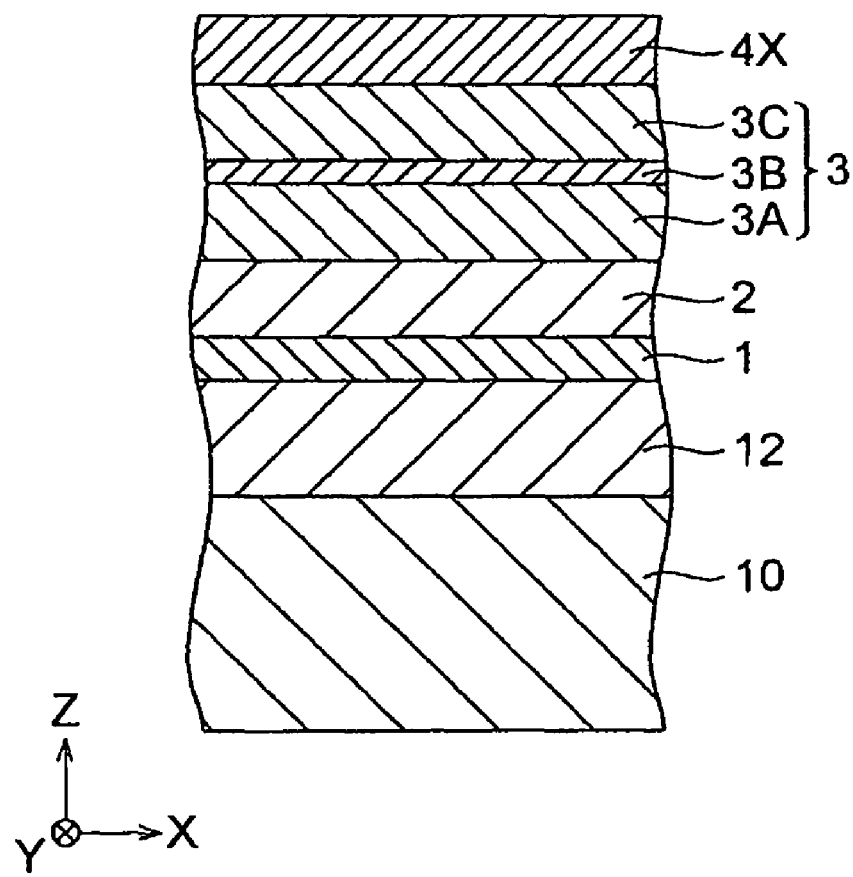
FIG. 16 is an end view of an intermediate body of the magnetic device 30.

First, as shown in FIG. 16, the underlayer 1 comprising Ta, Ta/NiFe, NiCr, or the like, the antiferromagnetic layer 2 comprising FeMn, 1 mm, Pt, NiMn, or the like, the lower ferromagnetic layer 3A comprising Co, an NiFe alloy, a CoFe alloy, or a half metal, the nonmagnetic intermediate layer 3B comprising Ru or the like, the upper ferromagnetic layer 3C comprising the same material as that of the lower ferromagnetic layer 3A, and an alloy layer 4X comprising two kinds of metals (e.g., Cu and Al) having different oxidizabilities are formed in this order above the lower electrode layer 12 formed on the silicon substrate 10, using a sputtering method, for example. In the case of using the sputtering method, the alloy layer 4X may be formed using an alloy target made of two kinds of metals or may be formed by simultaneously sputtering using separate targets of two kinds of metals.

Figure 17:
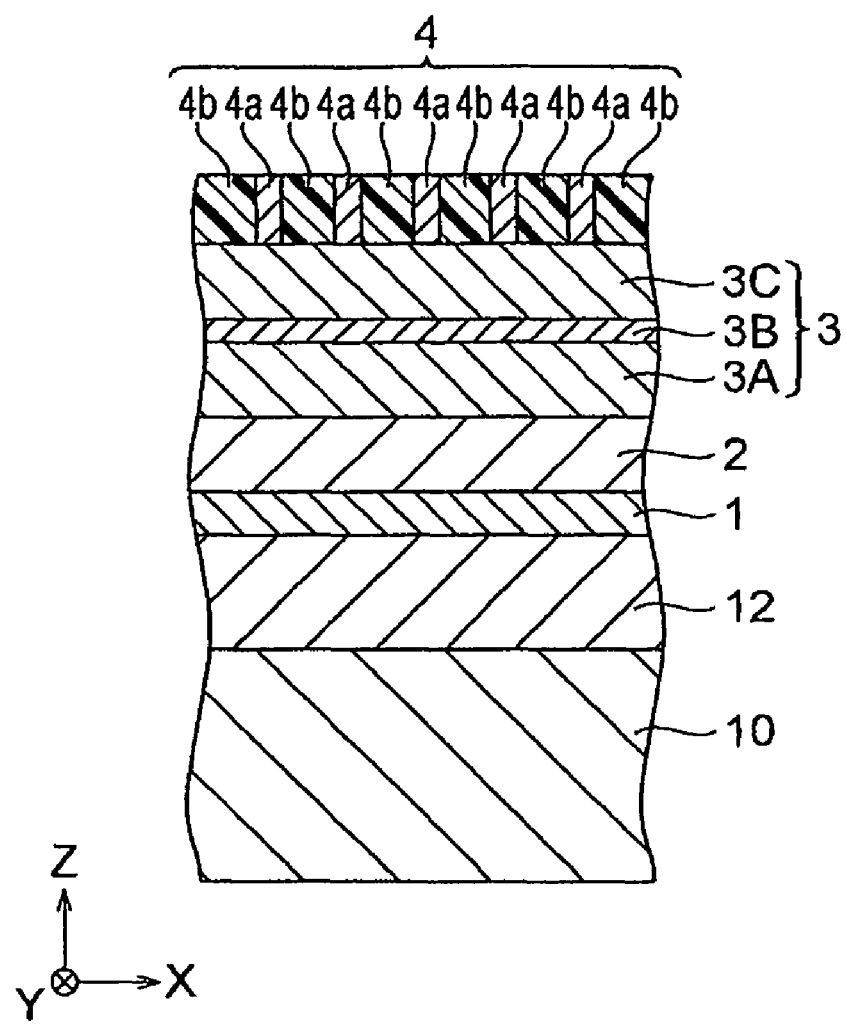
FIG. 17 is an end view of an intermediate body of the magnetic device 30.

Next, as shown in FIG. 17, by selectively oxidizing only the metal (e.g., Al) which is prone to oxidation among the metals constituting the alloy layer 4X, the nonmagnetic layer 4 comprising a plurality of current-constricting layer portions 4a comprising a conductive material such as Cu and a plurality of insulating layer portions 4b comprising an insulating material such as $Al_2O_3$ is formed. This selective oxidation can be realized, for example, by naturally oxidizing by introducing a predetermined flow rate of oxygen into a film forming chamber for a predetermined time period after forming the alloy layer 4X with the sputtering method. Moreover, this natural oxidation is preferably performed while irradiating the alloy layer 4X with Ar ions. This makes it possible, even if a part of the metal (e.g., Cu) which is hard to be oxidized has been oxidized, to reduce and return the oxidized metal to the metallic state by the Ar ion beam. In this manner, the nonmagnetic layer 4 comprising the insulating layer portion 4b and the current-constricting layer portion 4a which passes through the insulating layer portion 4b in its film thickness direction is formed. When the present inventors formed the nonmagnetic layer 4 using such a method, one cross-section area 4aS (see FIG. 5) of the current-constricting layer portion 4a could be $1.0 \times 10^{-4}$ µm$^2$.

Figure 18:
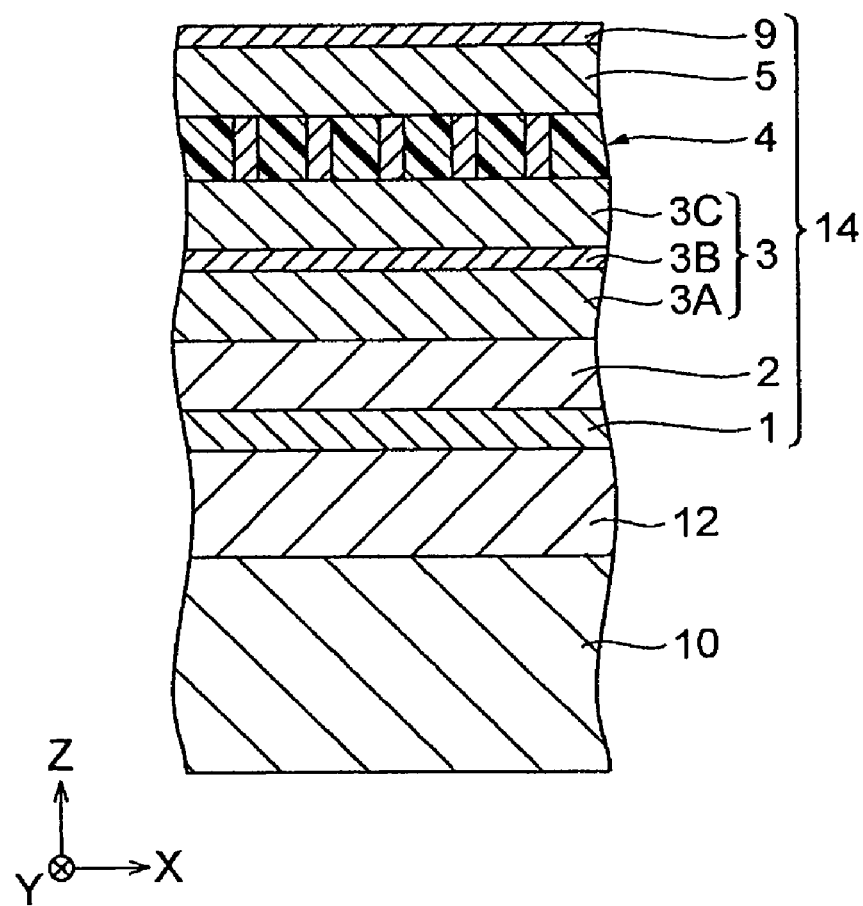
FIG. 18 is an end view of an intermediate body of the magnetic device 30.

Next, as shown in FIG. 18, the magnetization free layer 5 comprising a Co—Fe alloy, an Ni—Fe alloy, or the like, or a layered product of these, and the cap layer 9 comprising Ta or the like are formed sequentially above the nonmagnetic layer 4. In this manner, the magnetoresistive effect element 14 is formed.

Figure 19:
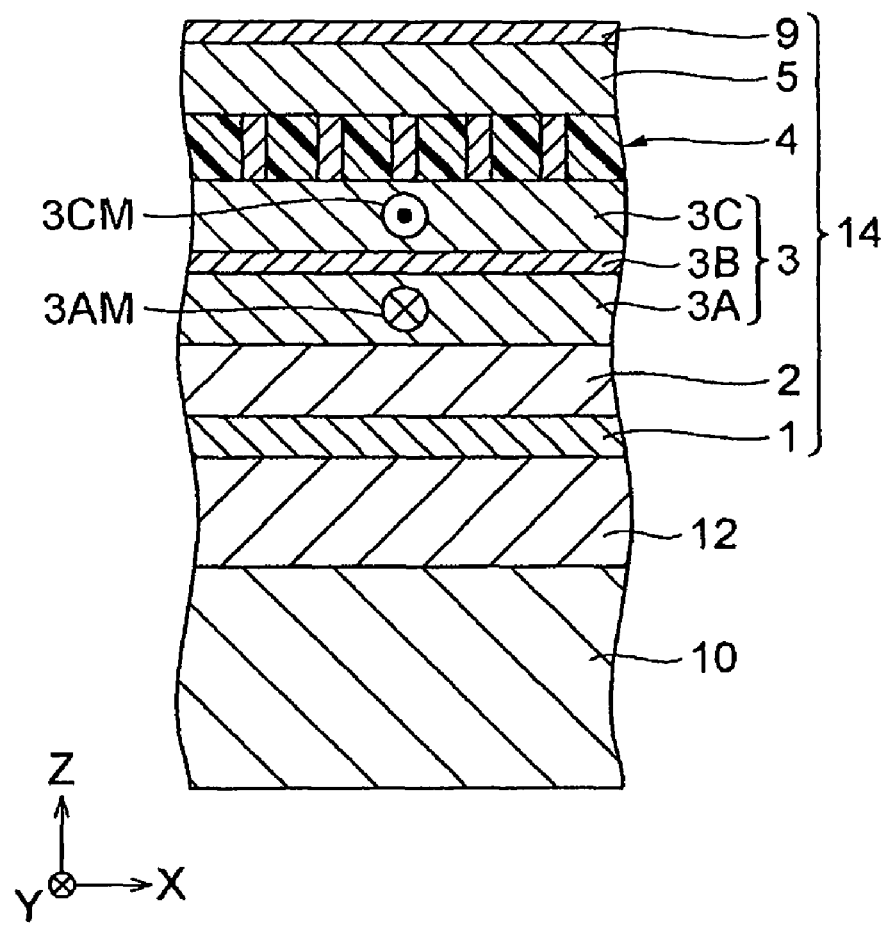
FIG. 19 is an end view of an intermediate body of the magnetic device 30.

Subsequently, an annealing treatment is carried out to the magnetoresistive effect element 14 while applying a magnetic field in the positive direction of the Y-axis of FIG. 18. The highest reachable temperature in this annealing treatment is set around the blocking temperature of the antiferromagnetic layer 2. Then, as shown in FIG. 19, the lower ferromagnetic layer 3A and the antiferromagnetic layer 2 are exchange-coupled to each other, and the magnetization direction 3AM of the lower ferromagnetic layer 3A is fixed in the positive direction of the Y-axis, which is the magnetic field applying direction during the annealing treatment. Then, the magnetization direction 3CM of the upper ferromagnetic layer 3C is fixed in the opposite direction (in the negative direction of the Y-axis) of the magnetization direction 3AM of the lower ferromagnetic layer 3A via the nonmagnetic intermediate layer 3B. Moreover, it is preferable that afterward the magnetization easy axis of the magnetization free layer 5 be set in the X-axis direction by carrying out an annealing treatment while applying a magnetic field in the X-axis direction. In this case, it is preferable to weaken the applied magnetic field and lower the heating temperature as compared with the case of the above-described annealing treatment for fixing the magnetization direction 3CM of the magnetization fixed layer 3, so as not to vary the magnetization direction 3CM of the magnetization fixed layer 3. Note that these annealing treatments may not be carried out immediately after forming the magnetoresistive effect element 14. For example, these annealing treatments may be carried out after forming the protective layer 22 (see FIG. 14A and FIG. 14B).

If the resonance of the spin device is used with the magnetic device 30 and the frequency detector 100 according to the embodiment as described above, the frequency analysis in GHz bands which cannot be obtained with the ordinary Si semiconductor technology can be performed. Accordingly, a further development in the communication technology can be expected.

Moreover, in the magnetic device 30 according to this embodiment, the current of the input AC signal i, in passing through the nonmagnetic layer 4 of the magnetoresistive effect element 4, cannot pass through the insulating layer portion 4b of the nonmagnetic layer 4 and will pass through only the current-constricting layer portion 4a (see FIG. 3). The present inventors have newly found that such a configuration of the nonmagnetic layer 4 of the magnetoresistive effect element 14 sufficiently reduces the half-value width of the peak of the output DC voltage of the magnetic device 30. The supposed principle of such a phenomenon will be described using FIG. 20A and FIG. 20B.

Figure 20A:
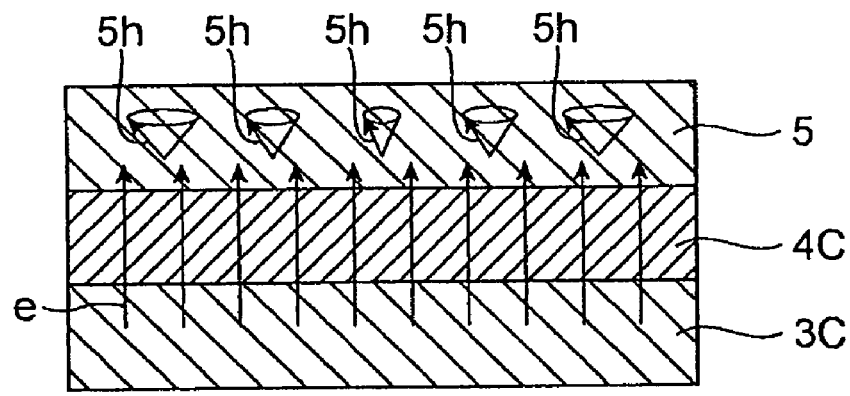
FIG. 20A is a view showing the principle that the half-value width of the peak of the output voltage becomes small.
Figure 20B:
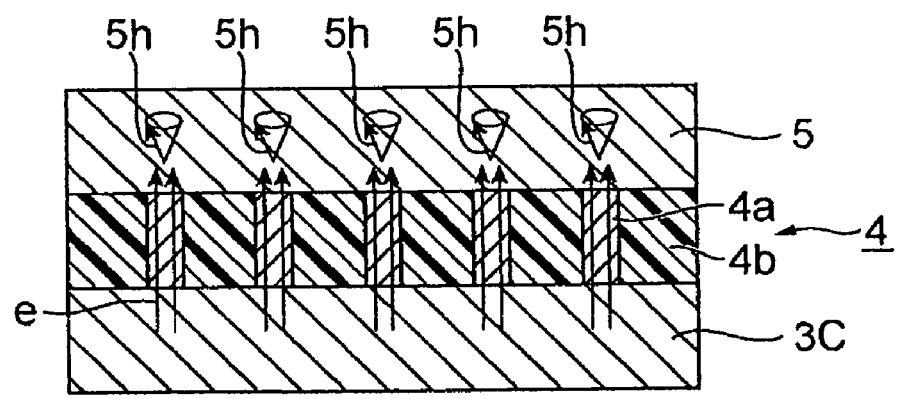
FIG. 20B is a view showing the principle that the half-value width of the peak of the output voltage becomes small.

FIG. 20A is a cross sectional view in the vicinity of the nonmagnetic layer which the magnetoresistive effect element of the conventional magnetic device has, while FIG. 20B is a cross sectional view in the vicinity of the nonmagnetic layer which the magnetoresistive effect element of the magnetic device according to this embodiment has. As shown in FIG. 20A, the nonmagnetic layer 4C which the magnetoresistive effect element of the conventional magnetic device has is formed of only a conductive material such as Cu. For this reason, when electrons e move from the upper ferromagnetic layer 3C toward the magnetization free layer 5, the electrons e will pass through the entire nonmagnetic layer 4C. Then, the electrons e having reached the magnetization free layer 5 will interact with the magnetization of the magnetization free layer 5 and generate a large number of magnetization resonances 5h within the magnetization free layer 5. In this case, since the electrons e have passed through the entire nonmagnetic layer 4C, there are the electrons e which resonate the magnetization in a relatively wide region within the magnetization free layer 5 and the electrons e which resonate the magnetization in a relatively narrow region within the magnetization free layer 5. As a result, the magnitudes of the resonances of the magnetization resonances 5*h* generated within the magnetization free layer 5 may vary widely, which results in a blunted peak shape of the output DC voltage of the magnetic device.

In contrast, as shown in FIG. 20B, the nonmagnetic layer 4 which the magnetoresistive effect element 14 of the magnetic device 30 according to this embodiment has comprises the insulating layer portion 4*b* comprising an insulating material and the current-constricting layer portion 4*a* which passes through the insulating layer portion 4*b* in its film thickness direction. For this reason, when electrons e move from the upper ferromagnetic layer 3C toward the magnetization free layer 5, the electrons e will pass through only the current-constricting layer portion 4*a* of the nonmagnetic layer 4. Then, the electrons e having reached the magnetization free layer 5 will interact with the magnetization of the magnetization free layer 5 and generate a large number of magnetization resonances 5*h* within the magnetization free layer 5. In this case, since the electrons e have passed through only the current-constricting layer portion 4*a* of the nonmagnetic layer 4, only the magnetization in a region in the vicinity of the current-constricting layer portion 4*a* within the magnetization free layer 5 will resonate with the electrons e. For this reason, the variation in the size of the resonating region within the magnetization free layer 5 becomes small as compared with the conventional one. As a result, the variation in the magnitudes of the resonances of the magnetization resonances 5*h* generated within the magnetization free layer 5 may be suppressed, which may result in a sharp peak shape of the output DC voltage of the magnetic device.

Furthermore, the magnetic device 30 according to this embodiment comprises the pair of bias magnetic field applying layers 18 as the magnetic field applying portion that is provided so as to apply the static magnetic field 18M2 to the magnetization free layer 5 (see FIG. 3). For this reason, if the material, film thickness, and the like of the magnetization free layer 5 are selected appropriately, a predetermined magnitude of magnetic field 18M2 can be applied to the magnetization free layer 5. Then, the natural frequency $f_F$ (the resonant frequency $f_0$) of the magnetization direction 5M of the magnetization free layer 5 is determined depending on the magnitude of the static magnetic field 5M applied to the magnetization free layer 5. This results in the magnetic device 30 which can output a DC component by selectively varying the voltage of a signal with a specific frequency corresponding to the component of the determined resonant frequency $f_0$ of the input AC signal i (see FIG. 1).

Furthermore, the magnetic device 30 according to this embodiment has preferably one cross-section area 4*a*S of 0.00001 to 0.01 μm² on the plane perpendicular to the thickness direction of the current-constricting layer portion 4*a* (see FIG. 3, FIG. 5). This significantly reduces the half-value width of the output DC voltage of the magnetic device 30.

Furthermore, the magnetic device 30 according to this embodiment makes preferably at least one of the lower ferromagnetic layer 3A, the upper ferromagnetic layer 3C, and the magnetization free layers 5 to be a layer comprising a half metal (see FIG. 3). This can increase the output DC voltage of the magnetic device 30. That is, since the spin polarization ratio of a half metal, such as a Heusler alloy, at room temperature is approximately 100%, the magnetoresistive effect ratio of the magnetoresistive effect element 14 will increase. For this reason, when the magnetization direction 5M of the magnetization free layer 5 resonates with the AC signal i flowing through the magnetoresistive effect element 14, the resistance value of the magnetoresistive effect element 14 will vary more abruptly at this frequency. This results in an increase in the output DC voltage of the magnetic device 30.

Furthermore, in the magnetic device 30 according to this embodiment, among the frequency components contained in the AC signal i, the frequency component corresponding to the natural frequency $f_F$ of the magnetization direction 5M of the magnetization free layer 5 resonates with the magnetization direction 5M of the magnetization free layer 5, and a DC voltage is output by varying the frequency component corresponding to the natural frequency $f_F$. Therefore, if the magnetic device 30 is manufactured so that the natural frequency $f_F$ of the magnetization free layer 5 may become a predetermined value, it is possible to provide the magnetic device 30 which can output a DC voltage by selectively varying the predetermined frequency component among the frequency components contained in the AC signal i.

Moreover, the frequency detector 100 of this embodiment comprises the above-described magnetic device 30 and the monitor circuit 40 for monitoring the voltage output from the pair of output terminals OUTPUT1, OUTPUT2 (see FIG. 1). This realizes the frequency detector 100 wherein the voltage of a signal with a specific frequency of the input AC signals i is detected by the monitor circuit 40.

Moreover, the frequency detector 100 of this embodiment further comprises the low pass filter L interposed between the monitor circuit 40 and the magnetoresistive effect element 14 (see FIG. 1). This allows only the DC component from the magnetoresistive effect element 14 to transmit therethrough and enter the monitor circuit 40. That is, since the AC signal i is applied between both ends of the magnetoresistive effect element 14, only the DC voltage of a signal with a specific frequency, the signal selectively varying of the AC signal i, can be extracted by providing the low pass filter.

EXAMPLE 1

Hereinafter, in order to clarify the effect of the present invention further, the description is made using examples and a comparative example. FIG. 21 to FIG. 24 are views showing a relationship of the frequency of an input signal vs. the output voltage with regard to magnetic devices concerning Examples 1 to 4. Moreover, FIG. 25 is a view showing a relationship of the frequency of an input signal vs. output voltage of a magnetic device concerning Comparative Example 1.

For the magnetic devices concerning Examples 1 to 4, the nonmagnetic layer which the magnetoresistive effect element has comprises the insulating layer portion 4*b* comprising an insulating material and the current-constricting layer portion 4*a* which passes through the insulating layer portion 4*b* in its film thickness direction (see FIG. 3, FIG. 5). Moreover, for the magnetic devices concerning Example 1 and Example 2, a ferromagnetic ferromagnetic layer 3A, the upper ferromagnetic layer 3C, and the magnetization free layer 5. Moreover, Example 1 and Example 2 differ in the method of manufacturing the nonmagnetic layer 4, particularly in the method of forming the current-constricting layer portion 4*a*. For the magnetic device concerning Example 1, the nonmagnetic layer 4 was formed using the manufacturing method in the above-described embodiment (see FIG. 16 and FIG. 17), and the cross-section area 4*a*S (see FIG. 5) of the current-constructing portion 4*a* was about 0.00003 μm².

On the other hand, for the magnetic device concerning Example 2, the nonmagnetic layer 4 was formed using the following manufacturing method. That is, first, a $SiO_2$ layer was formed above the magnetization fixed layer 3 with a CVD apparatus using $Si(OC_2H_5)_4$, for example (see FIG. 17).

Then, a resist pattern having an opening in a region where the current-constricting layer portion 4a is to be formed is formed above the SiO$_2$ layer, and the SiO$_2$ layer in the unmasked region is removed with a reactive ion etching apparatus using a C$_4$F$_8$ gas, for example. Then, a conductive metal, such as Cu, was deposited with a sputtering apparatus or the like, and this surface is planarized with a CMP apparatus or the like until the SiO$_2$ layer is exposed, thereby forming the nonmagnetic layer 4 comprising the current-constricting layer portion 4a and the insulating layer portion 4b as shown in FIG. 17. When the present inventors formed the nonmagnetic layer 4 using such a method, one cross-section area 4aS (see FIG. 5) perpendicular to the thickness direction of the current-constricting layer portion 4a was 0.004 µm$^2$.

Moreover, in Example 3, CO$_2$MnGe which is a half metal was used as the material forming the upper magnetic layer 3C of the fixed layer 3. Other structure is the same as that of Example 1. Moreover, for Comparative Example 1, the nonmagnetic layer is formed of only Cu, and other structure is the same as that of Example 1.

Figure 21:
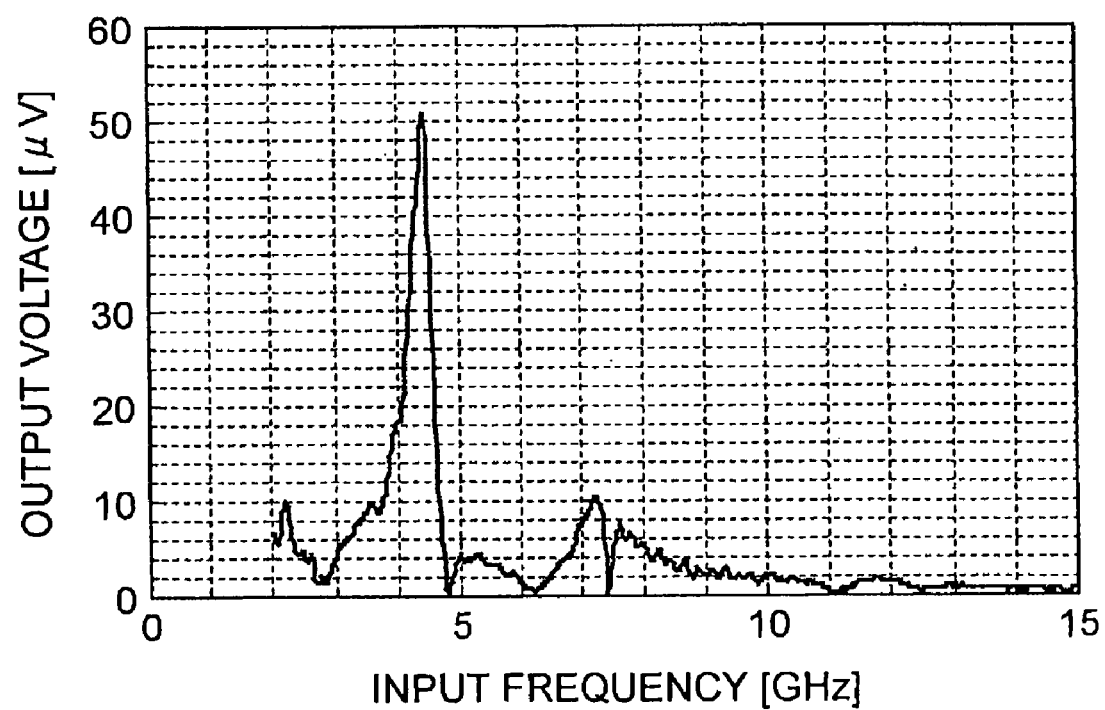
FIG. 21 is a view showing a relationship of the frequency of an input signal vs. the output voltage of a magnetic device concerning an example.
Figure 22:
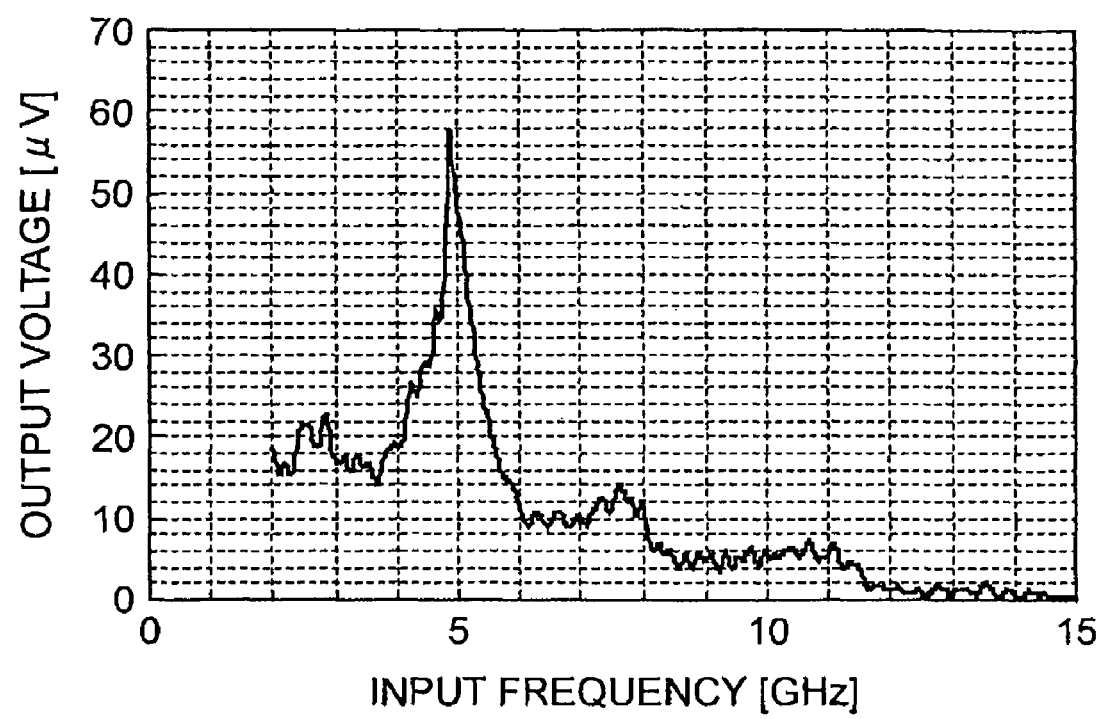
FIG. 22 is a view showing a relationship of the frequency of an input signal vs. output voltage of a magnetic device concerning an example.

As shown in FIG. 21, the output voltage of Example 1 exhibited a sharp peak shape with respect to the frequency of an input signal. Then, the maximum value of the output voltage was 51 µV and the half-value width of the peak of the output voltage was 0.30 [GHz]. Moreover, as shown in FIG. 22, the output voltage of Example 2 exhibited a sharp peak shape with respect to the frequency of an input signal. Then, the maximum value of the output voltage was 57 µV and the half-value width of the peak of the output voltage was 0.55 [GHz].

Figure 23:
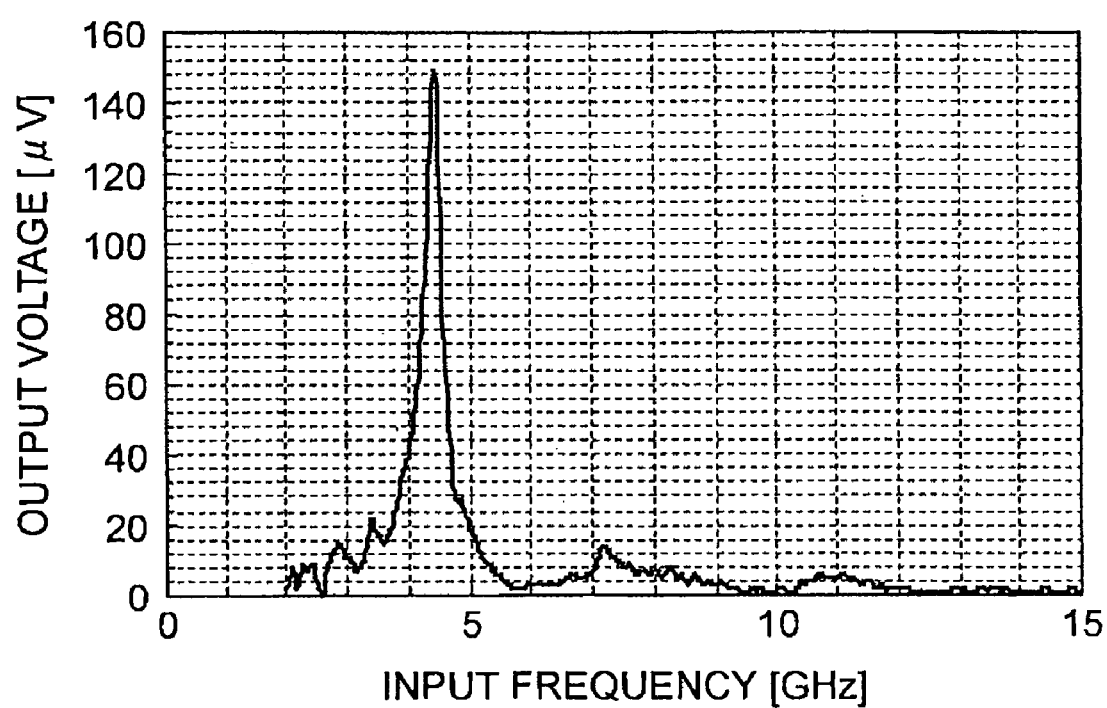
FIG. 23 is a view showing a relationship of the frequency of an input signal vs. output voltage of a magnetic device concerning an example.

Moreover, as shown in FIG. 23, the output voltage of Example 3 exhibited a sharp peak shape with respect to the frequency of an input signal. Then, the maximum value of the output voltage was 150 IV and the half-value width of the peak of the output voltage was 0.28 [GHz]. In Example 3, as described above, the maximum value of the output voltage has been increased in addition to the sharpened peak of the output voltage.

Figure 24:
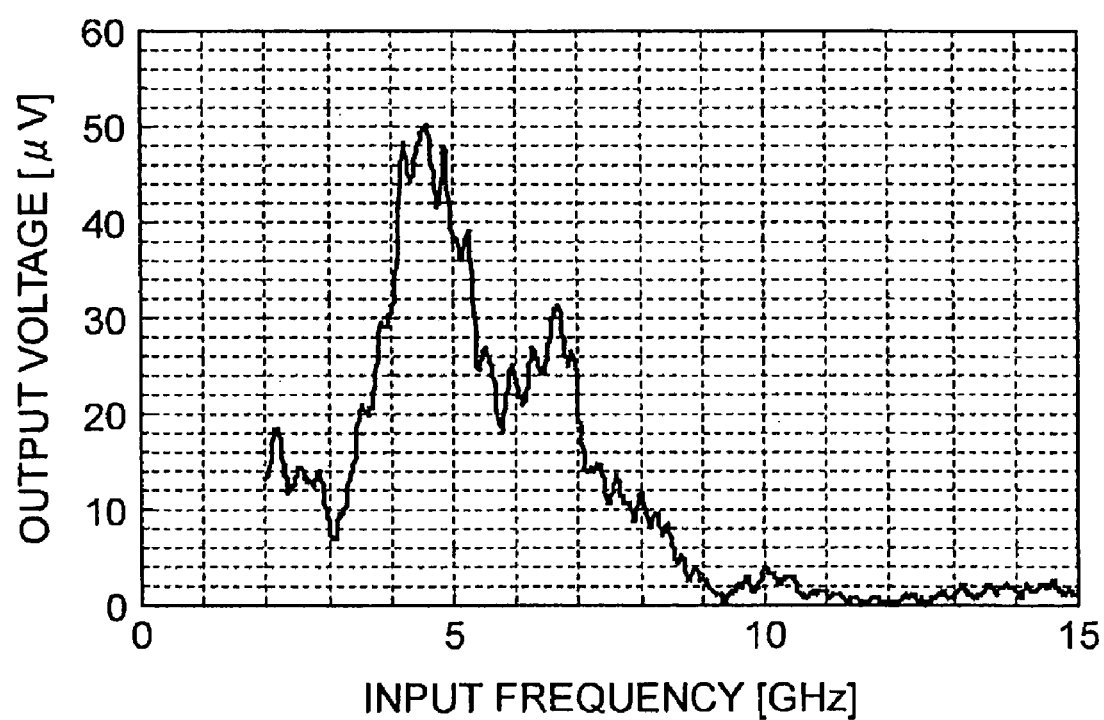
FIG. 24 is a view showing a relationship of the frequency of an input signal vs. output voltage of a magnetic device concerning a comparative example.
Figure 25:
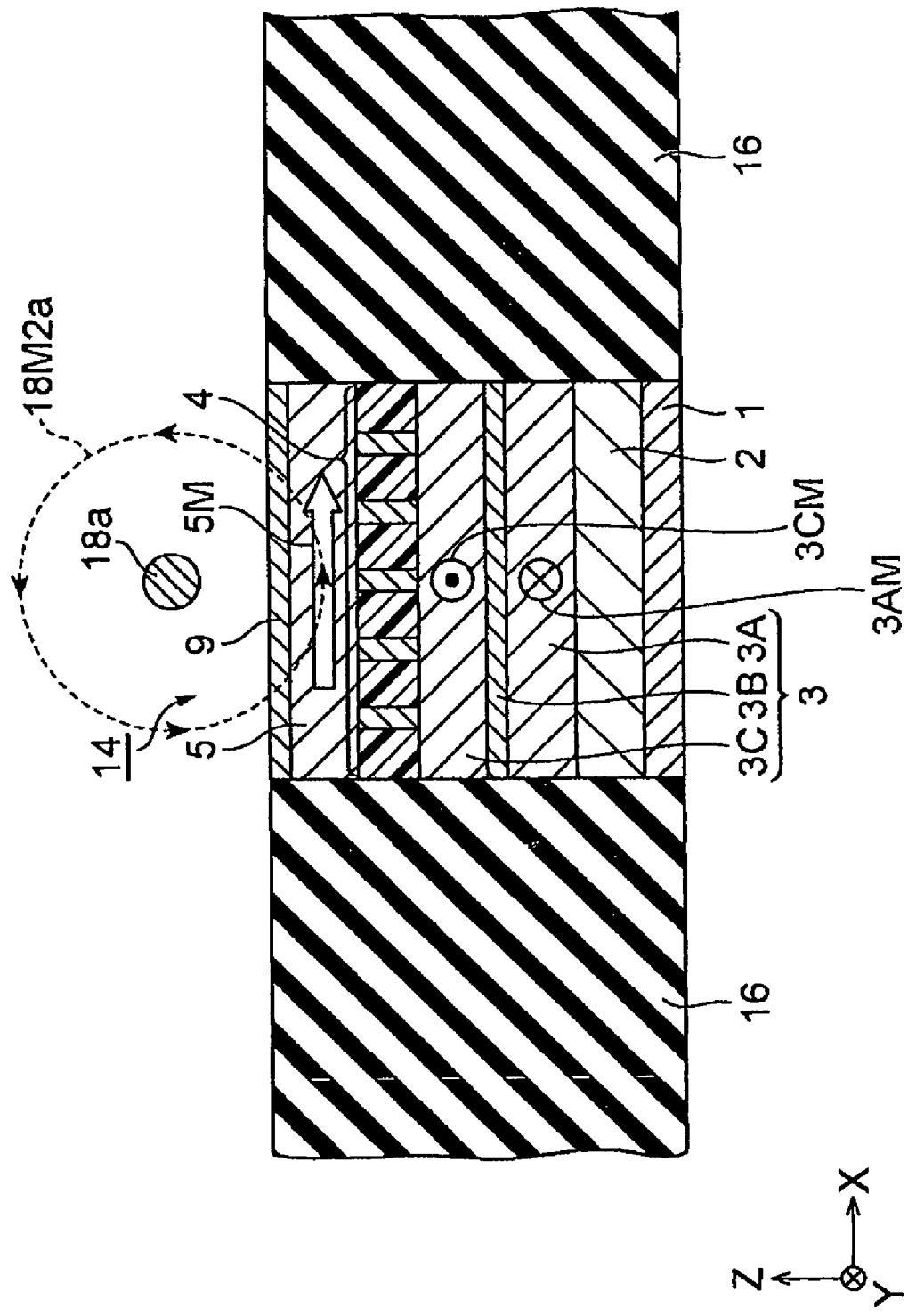
FIG. 25 is an end view showing a variation of embodiment.

On the other hand, as shown in FIG. 24, the output voltage of Comparative Example 1 exhibited a moderate peak shape with respect to the frequency of an input signal. Then, the maximum value of the output voltage was 50 µV and the half-value width of the peak of the output voltage was 1.30 [GHz].

The present invention is not limited to the above-described embodiment, and various modifications are possible.

For example, in the above-described embodiment, the pair of bias magnetic field applying layers 18 as the magnetic field applying portion are provided on both side faces of the magnetoresistive effect element 14 (see FIG. 3), but the magnetic field applying portion is not limited thereto. For example, in place of the bias magnetic field applying layer 18, a hard magnetic layer may be provided above the magnetization free layer 5 via the nonmagnetic layer within the magnetoresistive effect element 14. In this case, the hard magnetic layer serves as the magnetic field applying portion, and the static magnetic field generated therefrom is applied to the magnetization free layer 5. Moreover, the antiferromagnetic layer may be provided above the magnetization free layer 5 via the nonmagnetic layer or directly. In this case, the antiferromagnetic layer serves as the magnetic field applying portion, and the exchange coupling magnetic field generated therefrom is applied to the magnetization free layer 5.

Furthermore, as an alternative embodiment of the magnetic field applying portion, a structure as shown in FIG. 25 is also possible. That is, a current magnetic field generating portion 18a as the magnetic field applying portion may be provided close to the magnetoresistive effect element 14. The current magnetic field generating portion is formed of a conductive material extending along the Y-axis direction of FIG. 25, and by feeding a current therethrough a current magnetic field 18M2 is generated and this current magnetic field 18M2 is applied to the magnetization free layer 5.

Note that the present invention can be implemented even in a structure not specifically provided with the magnetic field applying portion.

Moreover, in the above-described embodiments, as the nonmagnetic layer, only the nonmagnetic layer 4 is provided between the magnetization fixed layer 3 and the magnetization free layer 5 of the magnetoresistive effect element 14, however, the nonmagnetic layer such as a Cu layer may be further provided between the nonmagnetic layer 4 and the magnetization fixed layer 3 or/and between the nonmagnetic layer 4 and the magnetization free layer 5.

Moreover, in the above-described embodiments, the magnetization fixed layer 3 comprises the lower ferromagnetic layer 3A, the nonmagnetic intermediate layer 3B, and the upper ferromagnetic layer 3C, however, the magnetization fixed layer 3 may comprise only the upper ferromagnetic layers 3C.

Moreover, a signal generating device for generating the AC signal may be provided further as the signal source S. Thereby, a magnetic device which processes a signal generated from the signal generating device can be obtained. If a VCO (Voltage Controlled Oscillator) is used as the signal generating device, this magnetic device can be used as a transmitter. Moreover, an antenna may be used as the signal generating device. In this case, a magnetic device for processing a signal received by the antenna can be obtained.

Figure 26:
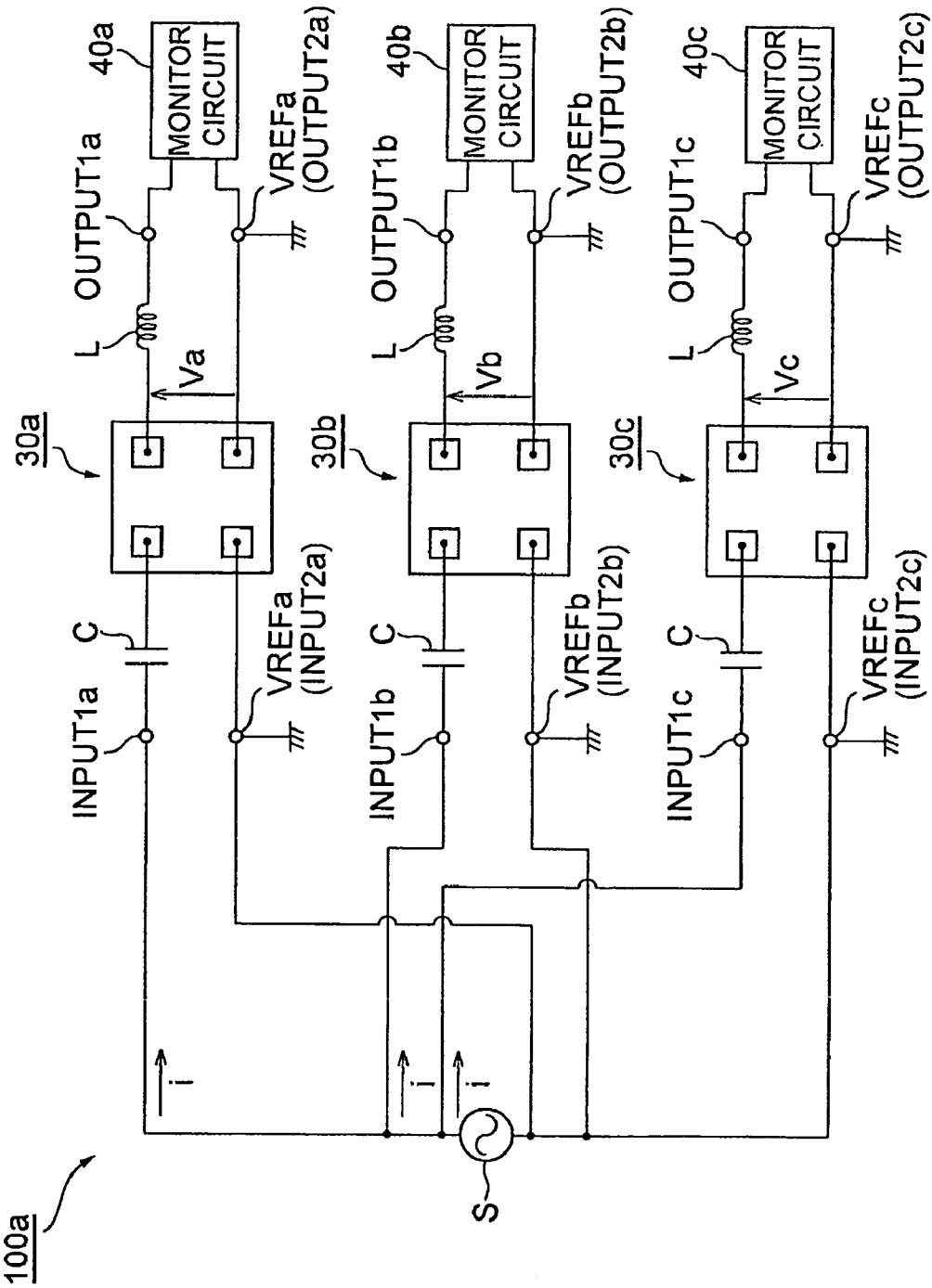
FIG. 26 is a schematic view showing the configuration of the variation of embodiment.

Moreover, as shown in FIG. 26, a frequency detector 100a comprising a plurality of magnetoresistive effect elements 30a, 30b, and 30c each having a different natural frequency f$_F$ and a plurality of output terminals OUTPUT1a, OUTPUT2a, OUTPUT1b, OUTPUT2b, OUTPUT1c, and OUTPUT2c for extracting the output voltages from the plurality of magnetoresistive effect elements 30a, 30b, and 30c is also possible. Here, the output terminals OUTPUT1a, OUTPUT1b, and OUTPUT1c respectively correspond to the output terminal OUTPUT1 in the above-described embodiment, the output terminals OUTPUT2a, OUTPUT2b, and OUTPUT2c respectively correspond to the output terminal OUTPUT2 in the above-described embodiment, and the magnetic devices 30a, and 30b and 30c respectively correspond to the magnetic device 30 in the above-described embodiment (see FIG. 1). This provides the frequency detector 100a which, when the AC signal i contains a plurality of frequency components, can vary a plurality of frequency components corresponding to a plurality of natural frequencies f$_F$ and accordingly output a plurality of voltages Va, Vb, and Vc, respectively. Here, the DC voltages Va, Vb, and Vc correspond to the output voltage V in the above-described embodiment, and the frequency detector 100a corresponds to the frequency detector 100 in the above-described embodiment (see FIG. 1).

What is claimed is:
1. A magnetic device, comprising:
a magnetoresistive effect element including a magnetization fixed layer, a magnetization free layer, and a nonmagnetic layer sandwiched between the magnetization fixed layer and the magnetization free layer;
an input terminal for feeding an AC signal to the magnetoresistive effect element in its stacking direction; and
an output terminal for extracting an output voltage from the magnetoresistive effect element, wherein the nonmagnetic layer includes an insulating layer portion comprising an insulating material, and a current-constricting layer portion comprising a conductive material which passes through the insulating layer portion in its film thickness direction.

2. The magnetic device according to claim 1, further comprising a magnetic field applying portion that is provided so as to apply a magnetic field to the magnetization free layer.

3. The magnetic device according to claim 1, wherein the current-constricting layer portion has a cross-section area of 0.00001 to 0.01 μm² on a plane perpendicular to its film thickness direction.

4. The magnetic device according to claim 1, wherein at least one of the magnetization fixed layer and the magnetization free layer includes a half metal layer.

5. The magnetic device according to claim 4, wherein the half metal layer comprises a Heusler alloy.

6. The magnetic device according to claim 1, wherein among frequency components contained in the AC signal, a frequency component corresponding to a natural frequency of a magnetization direction of the magnetization free layer resonates with the magnetization direction of the magnetization free layer, and varies the frequency component corresponding to the natural frequency to output a DC voltage.

7. The magnetic device according to claim 6, comprising a plurality of the magnetoresistive effect elements the natural frequencies of which differ from one another and a plurality of the output terminals for extracting output voltages from the plurality of the magnetoresistive effect elements.

8. The magnetic device according to claim 1, further comprising a signal generating device for generating the AC signal.

9. The magnetic device according to claim 8, wherein the signal generating device is an antenna.

10. A frequency detector comprising a magnetic device according to claim 1 and a monitor circuit for monitoring a voltage output from the output terminal.

11. The frequency detector according to claim 10, further comprising a low pass filter interposed between the monitor circuit and the magnetoresistive effect element.

* * * * *